(12) United States Patent
Hokama et al.

(10) Patent No.: US 11,870,213 B2
(45) Date of Patent: Jan. 9, 2024

(54) SEMICONDUCTOR LASER, SEMICONDUCTOR LASER ARRAY AND METHOD OF MANUFACTURING SEMICONDUCTOR LASER

(71) Applicant: Mitsubishi Electric Corporation, Tokyo (JP)

(72) Inventors: Yohei Hokama, Tokyo (JP); Yosuke Suzuki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 622 days.

(21) Appl. No.: 15/733,990

(22) PCT Filed: Sep. 26, 2018

(86) PCT No.: PCT/JP2018/035549
§ 371 (c)(1),
(2) Date: Dec. 1, 2020

(87) PCT Pub. No.: WO2020/065744
PCT Pub. Date: Apr. 2, 2020

(65) Prior Publication Data
US 2021/0218220 A1 Jul. 15, 2021

(51) Int. Cl.
*H01S 5/026* (2006.01)
*H01S 5/042* (2006.01)
(Continued)

(52) U.S. Cl.
CPC .......... *H01S 5/0264* (2013.01); *H01S 5/0421* (2013.01); *H01S 5/04256* (2019.08);
(Continued)

(58) Field of Classification Search
CPC ........................... H01S 5/2224; H01S 5/06258
(Continued)

(56) References Cited

U.S. PATENT DOCUMENTS

| 8,705,583 B2 * | 4/2014 | Matsuda | H01S 5/06258 372/50.11 |
| 2010/0142973 A1 * | 6/2010 | Gubenko | H01S 5/1025 372/50.1 |

(Continued)

FOREIGN PATENT DOCUMENTS

JP    2017-85007 A    5/2017

OTHER PUBLICATIONS

International Search Report; Written Opinion; and Notification of Transmittal of the International Search Report and the Written Opinion of the International Searching Authority, or the Declaration issued in PCT/JP2018/035549; dated Dec. 11, 2018.

*Primary Examiner* — Tuan N Nguyen
(74) *Attorney, Agent, or Firm* — Studebaker & Brackett PC

(57) ABSTRACT

A semiconductor laser in which a PD unit monitoring an optical output is integrated is provided. A semiconductor laser (100) includes: a DFB unit including a back surface side first cladding layer (3), a first diffraction grating layer (9), a light emitting layer (1) having a first MQW structure and emitting a laser beam, a front surface side first cladding layer (6), and a first contact layer (12) which are stacked; a DBR unit including a back surface side second cladding layer (4) having a resistivity higher than that of the back surface side first cladding layer (3), a second diffraction grating layer (10) reflecting part of the laser beam toward the DFB unit, a first core layer (2a) guiding a remnant of the laser beam and having an effective bandgap energy smaller than that of the first MQW structure, and a front surface side second cladding layer (7) having a resistivity higher than that of the front surface side first cladding layer (6) which are stacked; and a PD unit including a back surface side third cladding layer (5), a second core layer (2b) having a second MQW structure absorbing the remnant of the laser beam (Continued)

guided by the first core layer (2a), a front surface side third cladding layer (8), and a second contact layer (14) which are stacked.

16 Claims, 33 Drawing Sheets

(51) Int. Cl.
  *H01S 5/125* (2006.01)
  *H01S 5/227* (2006.01)
  *H01S 5/12* (2021.01)
(52) U.S. Cl.
  CPC ............... *H01S 5/12* (2013.01); *H01S 5/125* (2013.01); *H01S 5/2275* (2013.01)
(58) Field of Classification Search
  USPC ...................................... 372/50.21
  See application file for complete search history.

(56) References Cited

U.S. PATENT DOCUMENTS

| | | |
|---|---|---|
| 2017/0123172 A1 | 5/2017 | Adachi et al. |
| 2018/0041008 A1* | 2/2018 | Takagi .................. H01S 5/0265 |

* cited by examiner

A-A

SEMICONDUCTOR LASER, SEMICONDUCTOR LASER ARRAY AND METHOD OF MANUFACTURING SEMICONDUCTOR LASER

FIELD

The present disclosure relates to a semiconductor laser capable of monitoring an optical output, a semiconductor laser array and a method of manufacturing a semiconductor laser.

BACKGROUND

In the field of optical communication, a semiconductor laser is required to maintain a constant optical output for a long time. However, it is known that the optical output degrades as the semiconductor laser operates for a long time under application of constant current. Thus, a mechanism configured to detect degradation of the optical output and adjust the amount of current applied to the semiconductor laser to compensate for the degradation of the optical output is needed in long-time operation.

In a case of an end-face emission semiconductor laser, degradation of the optical output is detected by a method of measuring optical outputs from end faces on an optical output side and the opposite side in the semiconductor laser. Hereinafter, the end face on the optical output side is referred to as a front end surface, and the end face on the side opposite to the optical output side is referred to as a back end surface.

The optical output from the back end surface proportionally degrades as the optical output from the front end surface degrades, and thus the optical output from the front end surface can be maintained constant by adjusting the current amount to maintain constant the optical output from the back end surface. This method is an efficient method that does not waste the optical output from the front end surface but uses the optical output from the back end surface, which is not used as a signal, to detect optical output degradation, and thus has been typically used for a semiconductor laser in the field of optical communication.

The optical output from the back end surface is often measured by a photodiode (hereinafter referred to as a PD) installed on the back end surface side for monitoring. A beam from the back end surface is emitted at a large spread angle, and thus the PD has a light reception diameter equal to or larger than the spread.

Recently, a semiconductor laser array formed by integrating, into an array on one element, semiconductor lasers having optical output wavelengths different from one another has been required due to increase of the speed of optical communication and reduction of the size of a product package. When a plurality of optical outputs from the back end surface of the semiconductor laser array are to be received by the PDs, each PD potentially contacts an adjacent PD depending on the size thereof, and thus the distance between semiconductor lasers is restricted by the size of the PD, which prevents size reduction of the semiconductor laser array.

To solve the above-described problem, for example, PTL 1 discloses a semiconductor laser including integrated PDs. PTL 1 discloses a semiconductor laser in which a mirror unit as a distributed Bragg reflector laser (DBR laser) and a monitor PD unit are disposed adjacent to a back end surface of a DFB unit as a distributed feedback laser (DFB laser) in the stated order so that a laser beam output from the back end surface of the DFB unit is partially reflected by the DBR unit and light passing through the DBR unit is received by the monitor PD unit.

CITATION LIST

Patent Literature

[PTL 1] JP 2017-85007 A

SUMMARY

Technical Problem

However, in the semiconductor laser described in PTL 1, the DFB unit as a light emitting unit and the PD unit as a monitor have the same multi quantum well (MQW) structure. Thus, light emission characteristics of the DFB unit and light reception characteristics of the PD unit both need to be considered to design the configuration of the MQW structure. The light emission characteristics of the DFB unit, the light reception characteristics of the PD unit, or part of optical output characteristics of both units need to be sacrificed to set the configuration of the MQW structure.

In addition, a front surface side cladding layer in the DBR unit is a p-type InP layer same as those in the DFB unit and the PD unit, and thus there is no current barrier when current flowing in the p-type InP layer of the DFB unit flows to the p-type InP layer of the PD unit through the p-type InP layer of the DBR unit and then flows to the MQW structure of the PD unit. Accordingly, voltage applied to the MQW structure of the DFB unit encumbers reverse voltage applied to the MQW structure of the PD unit. Simultaneously, current flowing in the p-InP layer of the PD unit flows to the p-type InP layer of the DFB unit through the p-type InP layer of the DBR unit, and encumbers the voltage applied to the MQW structure of the DFB unit. Thus, the PD unit and the DFB unit both need to be controlled in association to maintain a constant optical output.

The present invention is intended to solve the problem as described above and provide a semiconductor laser in which a PD unit configured to monitor an optical output is integrated without degradation of optical output characteristics of the semiconductor laser, and a DFB unit and the PD unit can be independently operated while voltage applied to the PD unit is not changed by voltage applied to the DFB unit.

A semiconductor laser according to the present disclosure includes: a DFB unit including a back surface side first cladding layer of a first conductivity type, a first diffraction grating layer of a first conductivity type, a light emitting layer having a first MQW structure and emitting a laser beam, a front surface side first cladding layer of a second conductivity type, and a first contact layer of a second conductivity type which are stacked; a DBR unit including a back surface side second cladding layer having a resistivity higher than that of the back surface side first cladding layer, a second diffraction grating layer reflecting part of the laser beam toward the DFB unit, a first core layer guiding a remnant of the laser beam and having a second MQW structure having an effective bandgap energy smaller than that of the first MQW structure, and a front surface side second cladding layer having a resistivity higher than that of the front surface side first cladding layer which are stacked; and a PD unit including a back surface side third cladding layer of a first conductivity type, a second core layer having the second MQW structure absorbing the remnant of the laser beam guided by the first core layer of the DBR unit, a front surface side third cladding layer of a second conductivity type, and a second contact layer of a second conductivity type which are stacked.

A method of manufacturing a semiconductor laser according to the present disclosure includes: sequentially forming part of a back surface side cladding layer and a cladding layer for diffraction grating formation through crystal growth on a substrate on which each part of a DFB unit, a DBR unit adjacent to the DFB unit, and a PD unit adjacent to the DBR unit is to be formed; forming a first diffraction grating layer in the cladding layer for diffraction grating formation corresponding to the DFB unit and a second diffraction grating layer in the cladding layer for diffraction grating formation corresponding to the DBR unit by etching; forming a remnant of the back surface side cladding layer on the cladding layer for diffraction grating formation through crystal growth; injecting carriers into the back surface side cladding layers of the DFB unit and the PD unit; forming a light emitting layer having a first MQW structure on the back surface side cladding layer through crystal growth; after removing the light emitting layer in the DBR unit and the PD unit, forming a core layer having a second MQW structure having an effective bandgap energy smaller than that of the first MQW structure through crystal growth; sequentially forming a front surface side cladding layer and a contact layer on the light emitting layer and the core layer through crystal growth; injecting carriers into the front surface side cladding layer and the contact layer of the DFB unit and the PD unit; removing the substrate by grinding; forming front surface side electrodes on the contact layers of the DFB unit and the PD unit respectively; and forming a back surface side electrode on a surface of the back surface side cladding layer exposed by removing the substrate.

Advantageous Effects of Invention

In the semiconductor laser according to the present disclosure, the light emitting layer in the DFB unit and the core layer that operates as a PD unit are independent MQW structures. Thus, an optimum MQW structure can be set for each of the light emitting layer and the core layer that PDs can be integrated without optical output degradation. Between the electrodes on the front side and back side of the DFB unit and the electrodes on the front side and back side of the PD, there is a cladding layer with high current resistance in the DBR unit. Thus, since the voltage applied to the PD does not change depending on the voltage applied to the DFB unit, the DFB unit and the PD can independently operate.

In the semiconductor laser array according to the present disclosure, the distance between semiconductor lasers is not limited to the size of the PD unit, but the size of the semiconductor laser array can be reduced, and optical output characteristics do not degrade along with the size reduction.

The method of manufacturing a semiconductor laser according to the present disclosure, which is performed only through stack formation for uniform thickness distribution and etching fabrication for constant depth distribution, is a highly reproducible manufacturing method and thus can manufacture the semiconductor laser at high yield.

DESCRIPTION OF EMBODIMENTS

A semiconductor laser and a method of manufacturing the semiconductor laser according to the embodiments of the present disclosure will be described with reference to the drawings. The same components will be denoted by the same symbols, and the repeated description thereof may be omitted.

Embodiment 1

Figure 1:
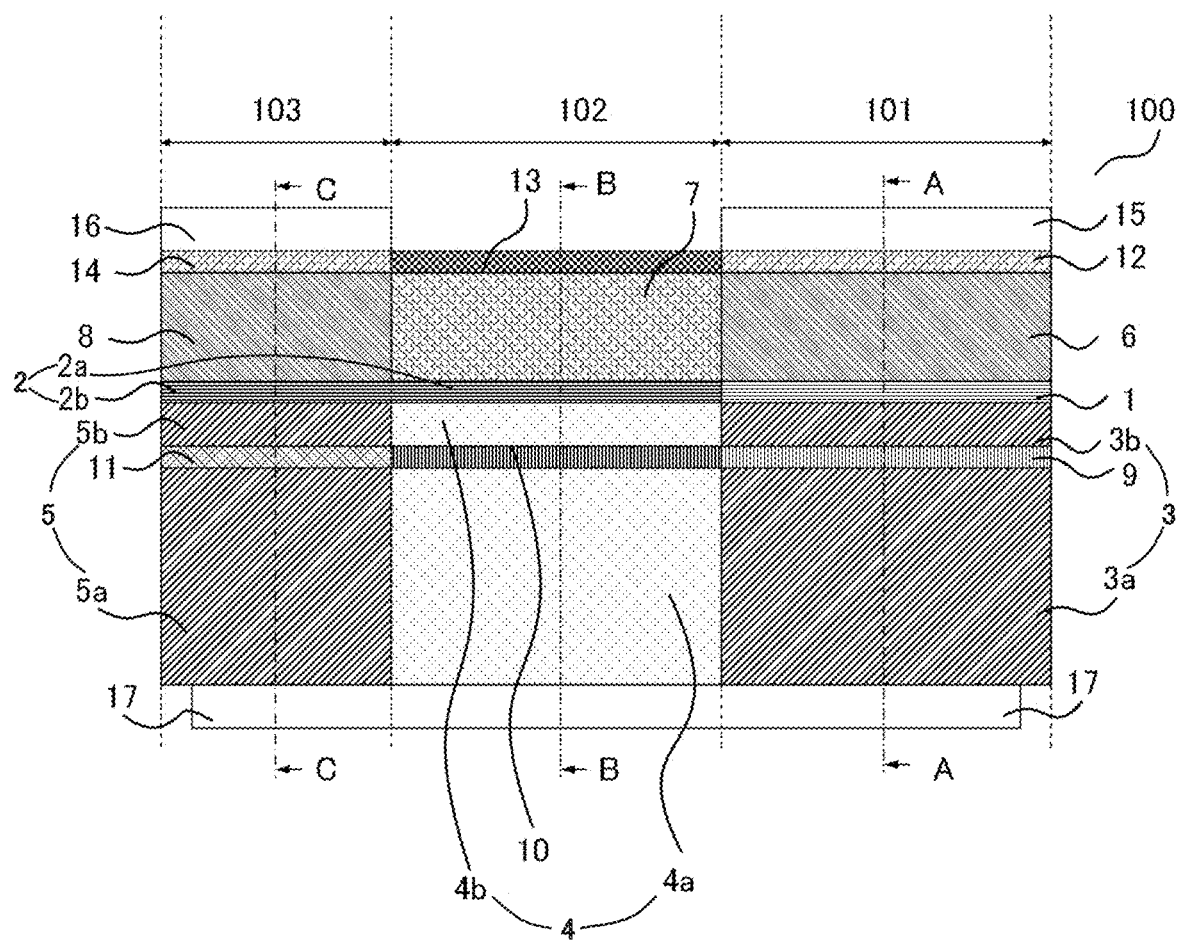
FIG. 1 is a cross-sectional view of a configuration of a semiconductor laser according to Embodiment 1.

The following describes the configuration of a semiconductor laser according to Embodiment 1 of the present invention. FIG. 1 is a cross-sectional view of the semiconductor laser according to the present Embodiment 1 in a waveguide direction.

In FIG. 1, this semiconductor laser 100 includes a DFB unit 101, a DBR unit 102, and a PD unit 103 which are arranged from a front end surface side, on which a laser beam is emitted, to a back end surface side opposite to the front end surface. The DBR unit 102 is disposed between the DFB unit 101 and the PD unit 103 and has one surface contacting the DFB unit 101 and the other surface contacting the PD unit 103. The DFB unit 101, the DBR unit 102, and the PD unit 103 include a back surface side electrode 17 provided in common, and the DFB unit 101 and the PD unit 103 include a front surface side first electrode 15 and a front surface side second electrode 16, respectively, on front surface sides thereof.

The DFB unit 101 has a configuration in which a back surface side first cladding layer 3a, a first diffraction grating layer 9, a back surface side first cladding layer 3b, a light emitting layer (active layer of the DFB unit) 1, a front surface side first cladding layer 6, a first contact layer 12, and the front surface side first electrode 15 are provided in the stated order on the back surface side electrode 17. As current flows from the front surface side first electrode 15 to the back surface side electrode 17 upon voltage application, a laser beam is generated in the light emitting layer 1 having a first MQW structure, and the wavelength of the laser beam is selected by the pitch interval of a diffraction grating of the first diffraction grating layer 9, which is a DFB laser structure. The back surface side first cladding layer 3a, the first diffraction grating layer 9, the back surface side first cladding layer 3b are of a first conductivity type, and the front surface side first cladding layer 6 and the first contact layer 12 are of a second conductivity type. The first MQW structure has a configuration in which a plurality of well layers and a plurality of barrier layers are stacked.

The DBR unit 102 has one surface contacting the DFB unit 101 and has a function to partially reflect a laser beam output from the DFB unit 101. The DBR unit 102 has a configuration in which a back surface side second cladding layer 4a, a second diffraction grating layer 10, a back surface side second cladding layer 4b, a first core layer 2a having a second MQW structure, a front surface side second cladding layer 7, and a second contact layer 13 are provided in the stated order on the back surface side electrode 17, and has a DBR structure in which a laser beam guided from the DFB unit 101 to the DBR unit 102 side is reflected toward the DFB unit 101 side at a ratio set in a wavelength band selected by the pitch interval of the second diffraction grating layer 10. The second MQW structure will be described later.

A crystalline material having a high resistivity is used for the back surface side second cladding layer 4a, the back surface side second cladding layer 4b, the front surface side second cladding layer 7, and the second contact layer 13 of the DBR unit 102, and thus the DFB unit 101 and the PD unit 103 can be electrically insulated from each other.

Specifically, the back surface side second cladding layer 4a and the back surface side second cladding layer 4b of the DBR unit 102 have resistivities higher than those of the back surface side first cladding layer 3a and the back surface side first cladding layer 3b of the DFB unit 101. The front surface side second cladding layer 7 and the second contact layer 13 of the DBR unit 102 have resistivities higher than those of the front surface side first cladding layer 6 and the first contact layer 12 of the DFB unit 101. The resistivities of the back surface side second cladding layer 4a and the back surface side second cladding layer 4b are preferably 10 times or more as high as those of the back surface side first cladding layer 3a and the back surface side first cladding layer 3b, and the resistivity of the front surface side second cladding layer 7 is preferably 10 times or more as high as that of the front surface side first cladding layer 6.

The PD unit 103 has a configuration in which a back surface side third cladding layer 5a, a fourth cladding layer 11, a back surface side third cladding layer 5b, a second core layer 2b, a front surface side third cladding layer 8, a third contact layer 14, and the front surface side second electrode 16 are provided in the stated order on the back surface side electrode 17, and has a PD structure in which, as voltage is applied from the back surface side electrode 17 to the front surface side second electrode 16, an optical output passing through the DBR unit 102 from the DFB unit 101 is received by the second core layer 2b and converted into current to be measured as a current value.

To absorb a laser beam generated in the DFB unit 101, the second core layer 2b has the second MQW structure having an effective bandgap energy smaller than that of the above-described first MQW structure. As an example in which the effective bandgap energy of the second MQW structure is set to be smaller than that of the first MQW structure, the layer thickness of each well layer included in the first MQW structure is set to be smaller than the layer thickness of each well layer included in the second MQW structure. With this configuration, the first MQW structure is the light emitting layer 1 that emits a laser beam having relatively high energy, whereas the second MQW structure, which has an effective bandgap energy smaller than that of the first MQW structure, functions to absorb the laser beam. Thus, an optimum MQW structure can be set for each of the light emitting layer 1 and the second core layer 2b so that PDs can be integrated without optical output degradation.

In this example, the first core layer 2a of the DBR unit 102 is set to have the second MQW structure. The first core layer 2a may have the first MQW structure or may have a MQW structure different from the MQW structures of the DFB unit 101 and the PD unit 103. In drawings, the first core layer 2a and the second core layer 2b are collectively referred to as a core layer 2.

The back surface side third cladding layer 5a, the fourth cladding layer 11, and the back surface side third cladding layer 5b are of the first conductivity type, and the front surface side third cladding layer 8 and the third contact layer 14 are of the second conductivity type.

The back surface side second cladding layer 4a and the back surface side second cladding layer 4b of the DBR unit 102 have resistivities higher than those of the back surface side third cladding layer 5a and the back surface side third cladding layer 5b. The front surface side second cladding layer 7 and the second contact layer 13 of the DBR unit 102 have resistivities higher than those of the front surface side third cladding layer 8 and the third contact layer 14. Similarly to the above description, the resistivities of the back surface side second cladding layer 4a and the back surface side second cladding layer 4b are preferably 10 times or more as high as those of the back surface side third cladding layer 5a and the back surface side third cladding layer 5b, and the resistivity of the front surface side second cladding layer 7 is preferably 10 times or more as high as that of the front surface side third cladding layer 8. In other words, the cladding layers on the back surface side and the front surface side of the DBR unit 102 are what are called high-resistivity layers that electrically insulate the DFB unit 101 and the PD unit 103 from each other.

The second contact layer 13 of the DBR unit 102 functions to form the first contact layer 12 of the DFB unit 101 and the third contact layer 14 of the PD unit 103 having uniform thickness distribution and has an effect as a protective layer of the front surface side second cladding layer 7. However, the layer does not affect output characteristics of a laser beam nor current amount measurement at the PD unit 103, and thus is not necessarily needed.

The following describes the positional relation of the layers of each of the DFB unit 101, the DBR unit 102, and the PD unit 103 with the layers of the other units.

The back surface side first cladding layer 3a of the DFB unit 101, the back surface side second cladding layer 4a of the DBR unit 102, and the back surface side third cladding layer 5a of the PD unit 103 are adjacent to each other in the laser beam waveguide direction on the back surface side electrode 17.

The first diffraction grating layer 9 of the DFB unit 101, the second diffraction grating layer 10 of the DBR unit 102, and the fourth cladding layer 11 of the PD unit 103 are adjacent to each other.

The back surface side first cladding layer 3b of the DFB unit 101, the back surface side second cladding layer 4b of the DBR unit 102, and the back surface side third cladding layer 5b of the PD unit 103 are adjacent to each other.

The light emitting layer 1 of the DFB unit 101, the first core layer 2a of the DBR unit 102, and the second core layer 2b of the PD unit 103 are adjacent to each other.

The front surface side first cladding layer 6 of the DFB unit 101, the front surface side second cladding layer 7 of the DBR unit 102, and the front surface side third cladding layer 8 of the PD unit 103 are adjacent to each other.

The first contact layer 12 of the DFB unit 101, the second contact layer 13 of the DBR unit 102, and the third contact layer 14 of the PD unit 103 are adjacent to each other.

Figure 2:
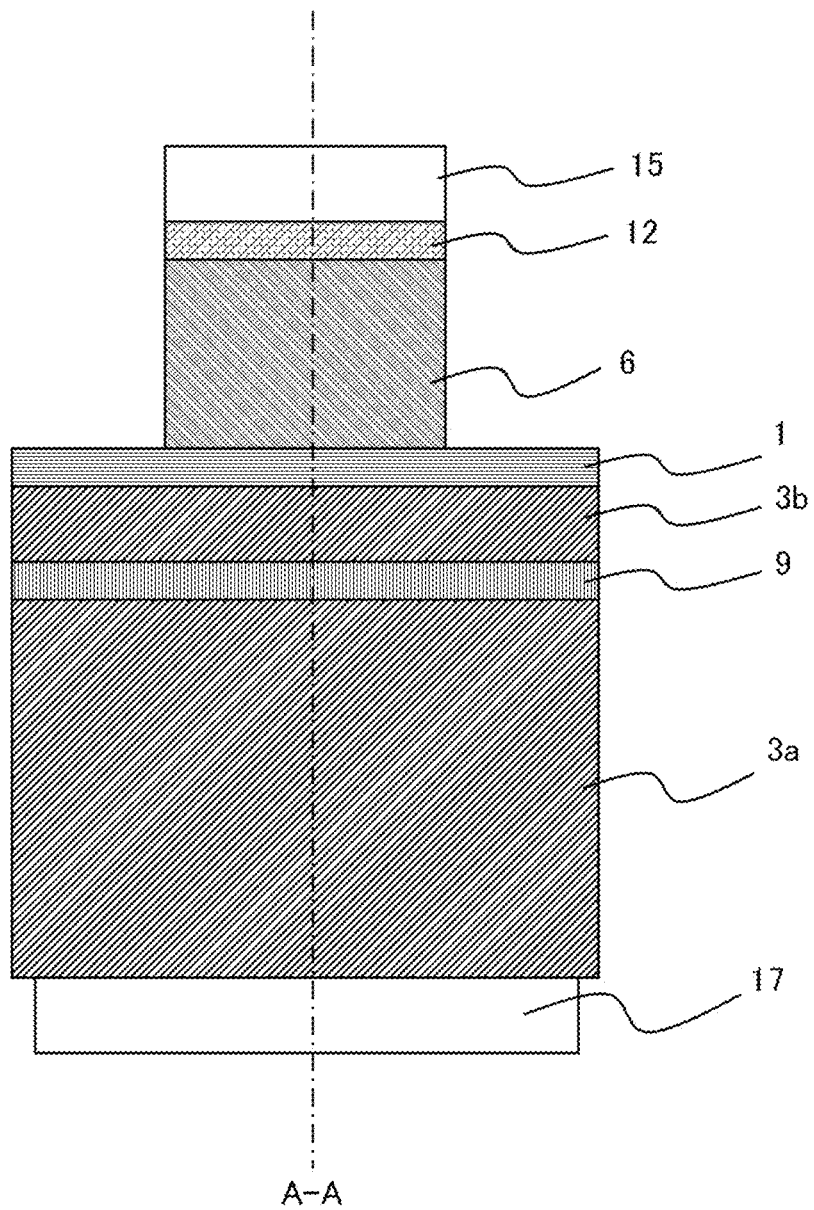
FIG. 2 is a cross-sectional view of a ridge waveguide structure of a DFB unit of a semiconductor laser according to Embodiment 1.
Figure 3:
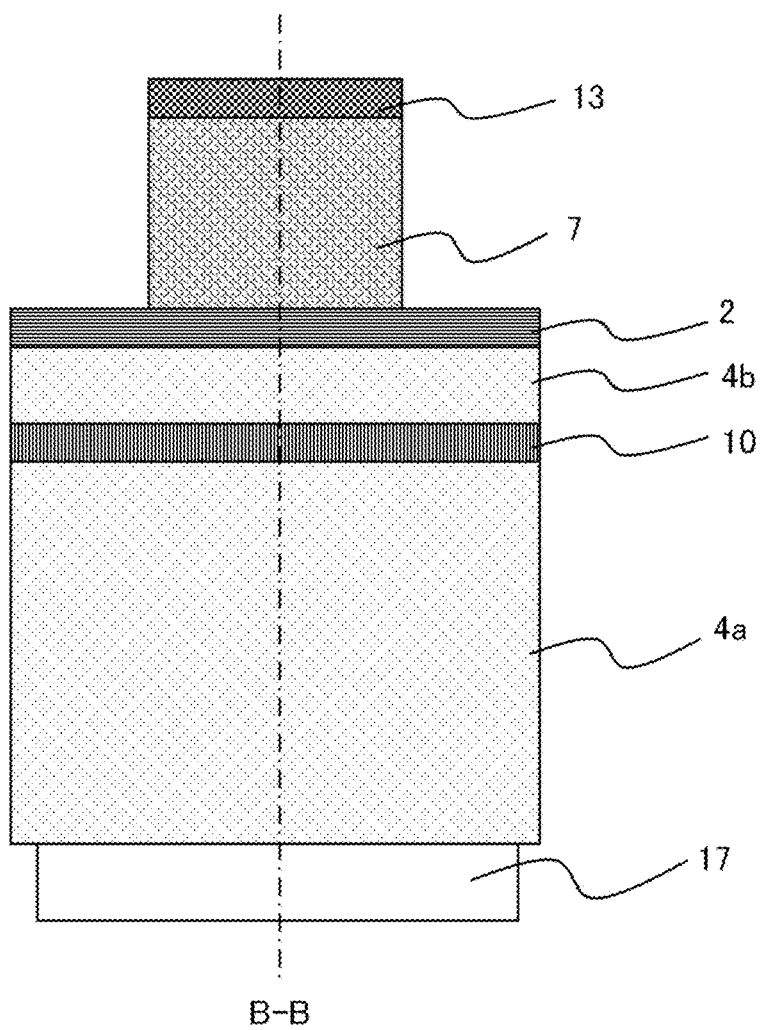
FIG. 3 is a cross-sectional view of a ridge waveguide structure of a DBR unit of a semiconductor laser according to Embodiment 1.
Figure 4:
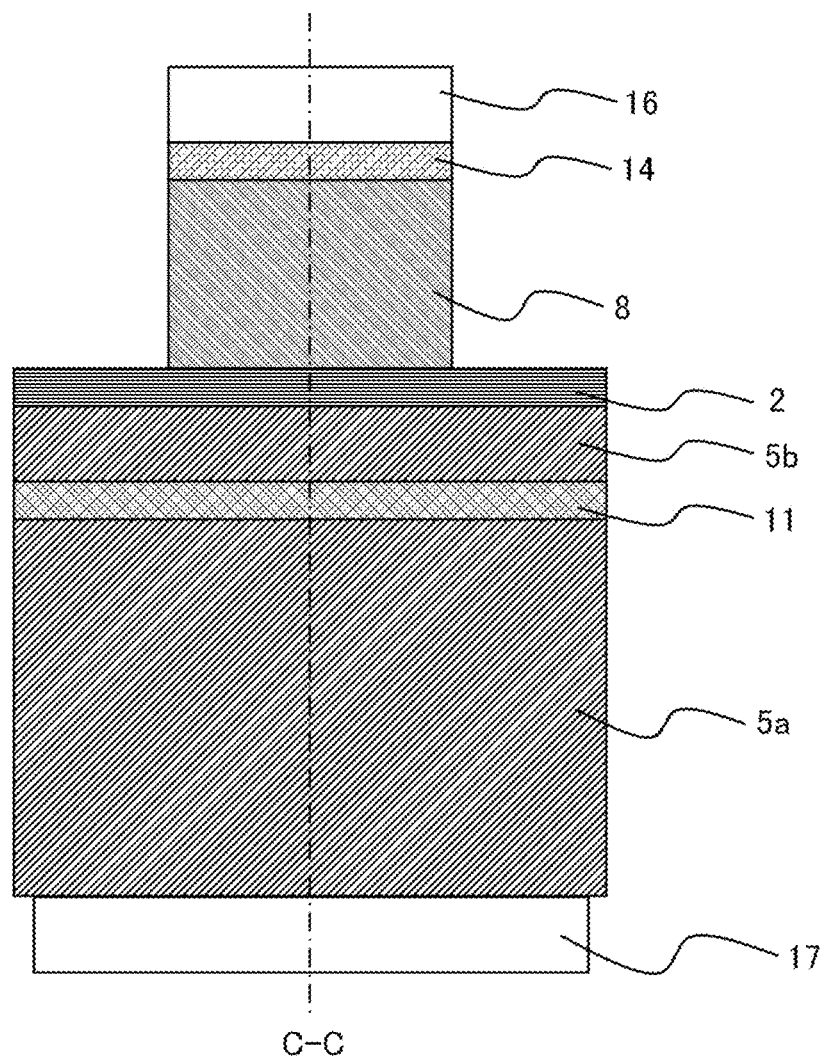
FIG. 4 is a cross-sectional view of a ridge waveguide structure of a PD unit of a semiconductor laser according to Embodiment 1.

As for sectional structures of the DFB unit 101, the DBR unit 102, and the PD unit 103 in a direction orthogonal to the light waveguide direction, a section of the DFB unit 101 is illustrated in FIG. 2, a section of the DBR unit 102 is illustrated in FIG. 3, and a section of the PD unit 103 is illustrated in FIG. 4.

As illustrated in FIG. 2, the front surface side first cladding layer 6, the first contact layer 12, and the front surface side first electrode 15 on the light emitting layer 1 form a ridge waveguide structure in the DFB unit 101.

As illustrated in FIG. 3, the front surface side second cladding layer 7 and the second contact layer 13 on the first core layer 2a form a ridge waveguide structure in the DBR unit 102.

As illustrated in FIG. 4, the front surface side third cladding layer 8, the third contact layer 14, and the front surface side second electrode 16 on the second core layer 2b form a ridge waveguide structure in the PD unit 103.

The following describes the operation of the semiconductor laser according to Embodiment 1. A laser beam generated in the DFB unit 101 as a laser oscillation region of the semiconductor laser 100 is guided as described below.

As voltage is applied from the front surface side first electrode 15 of the DFB unit 101 to the back surface side electrode 17, a laser beam emitted from the light emitting layer 1 is subjected to wavelength band selection by the first diffraction grating layer 9 and emitted from the front end surface. Simultaneously, the laser beam is guided from the light emitting layer 1 of the DFB unit 101 to the first core layer 2a of the DBR unit 102.

The laser beam guided to the DBR unit 102 is reflected to the DFB unit 101 in a wavelength band and at an optical output ratio that are set by the second diffraction grating layer 10, and the remaining optical output is guided to the second core layer 2b of the PD unit 103.

As reverse voltage is applied from the back surface side electrode 17 to the front surface side second electrode 16, the laser beam guided to the PD unit 103 is received and converted into current at the second core layer 2*b* of the PD unit 103, and thus an optical output can be measured as a current amount.

The voltage applied to the DFB unit 101 is reverse voltage of the voltage applied to the PD unit 103. The DFB unit 101 and the PD unit 103 are electrically insulated from each other since the back surface side second cladding layer 4*a*, the back surface side second cladding layer 4*b*, and the front surface side second cladding layer 7 of the DBR unit 102 are configured as high-resistivity layers, and thus no failure such as current flow from the DFB unit 101 to the PD unit 103 occurs.

The following describes a method of manufacturing the semiconductor laser according to Embodiment 1. FIGS. 5 to 16 are cross-sectional views illustrating processes of manufacturing the semiconductor laser according to Embodiment 1 of the present invention.

Figure 5:
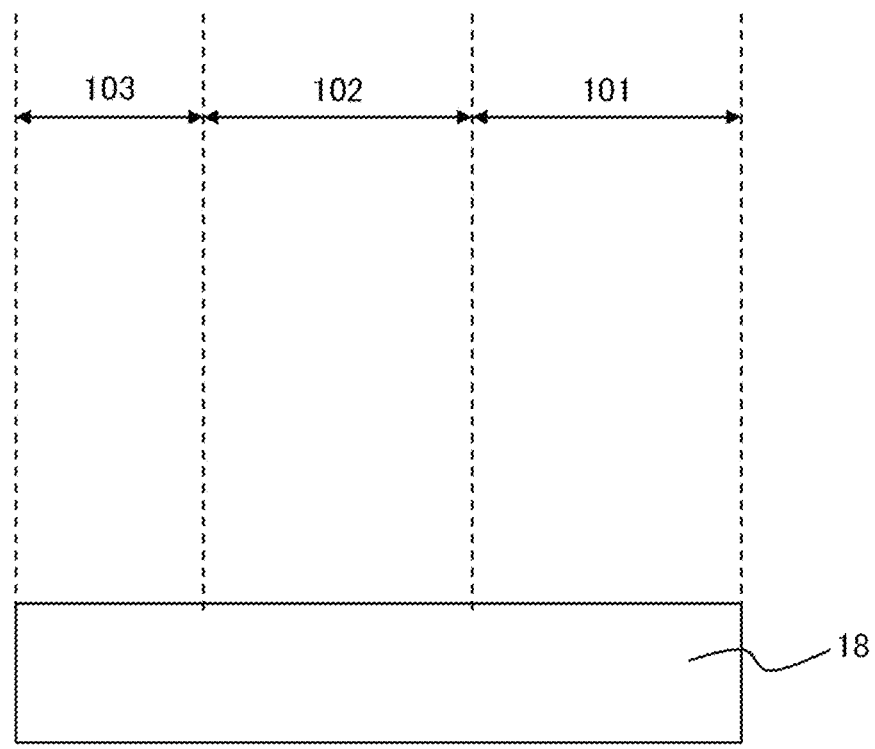
FIG. 5 is a cross-sectional view illustrating a method of manufacturing a semiconductor laser according to Embodiment 1
Figure 6:
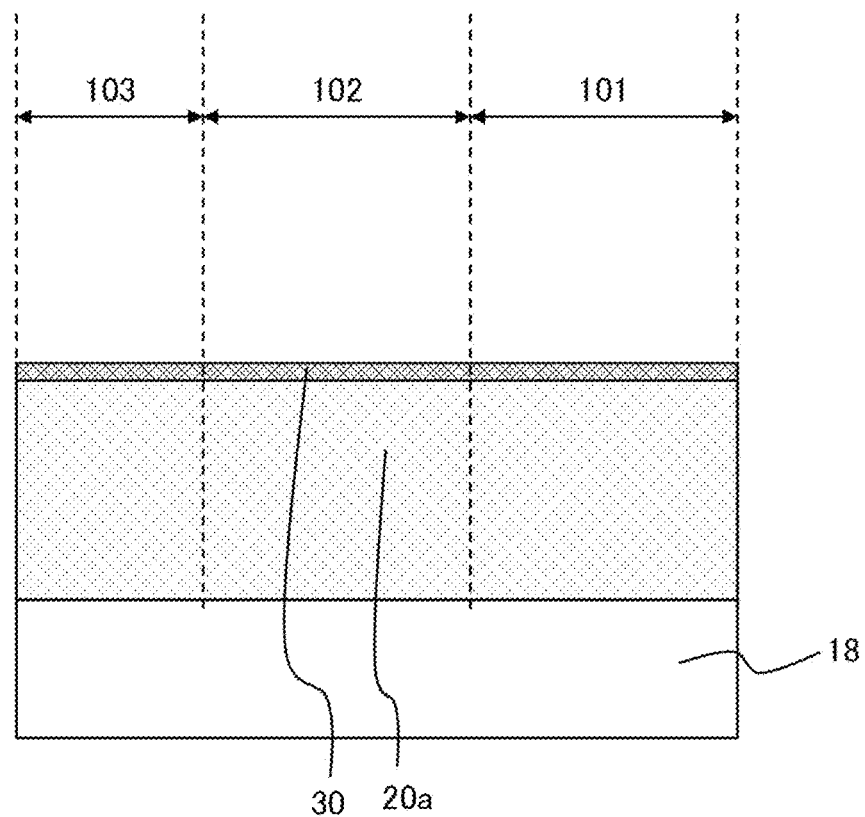
FIG. 6 is a cross-sectional view illustrating a method of manufacturing a semiconductor laser according to Embodiment 1

First, as illustrated in FIG. 6, a back surface side cladding layer 20*a* and a cladding layer 30 are sequentially formed on a substrate 18 illustrated in FIG. 5 through crystal growth. The back surface side cladding layer 20*a* and the cladding layer 30 are high-resistivity layers made of crystalline materials different from each other.

Figure 7:
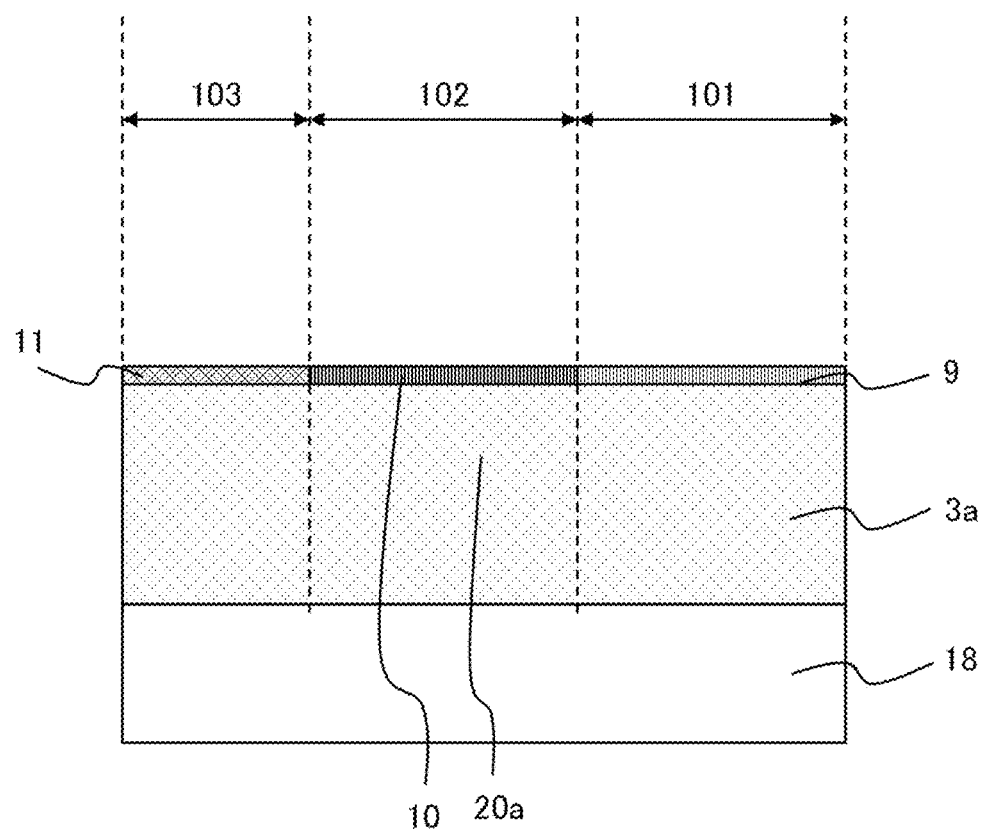
FIG. 7 is a cross-sectional view illustrating a method of manufacturing a semiconductor laser according to Embodiment 1

Subsequently, as illustrated in FIG. 7, part of the cladding layer 30 is fabricated in a diffraction grating pattern by etching for diffraction grating formation, and the first diffraction grating layer 9 corresponding to the DFB unit 101 and the second diffraction grating layer 10 corresponding to the DBR unit 102 are formed. The cladding layer 30 of the PD unit 103 corresponds to the fourth cladding layer 11 in a device structure.

Figure 8:
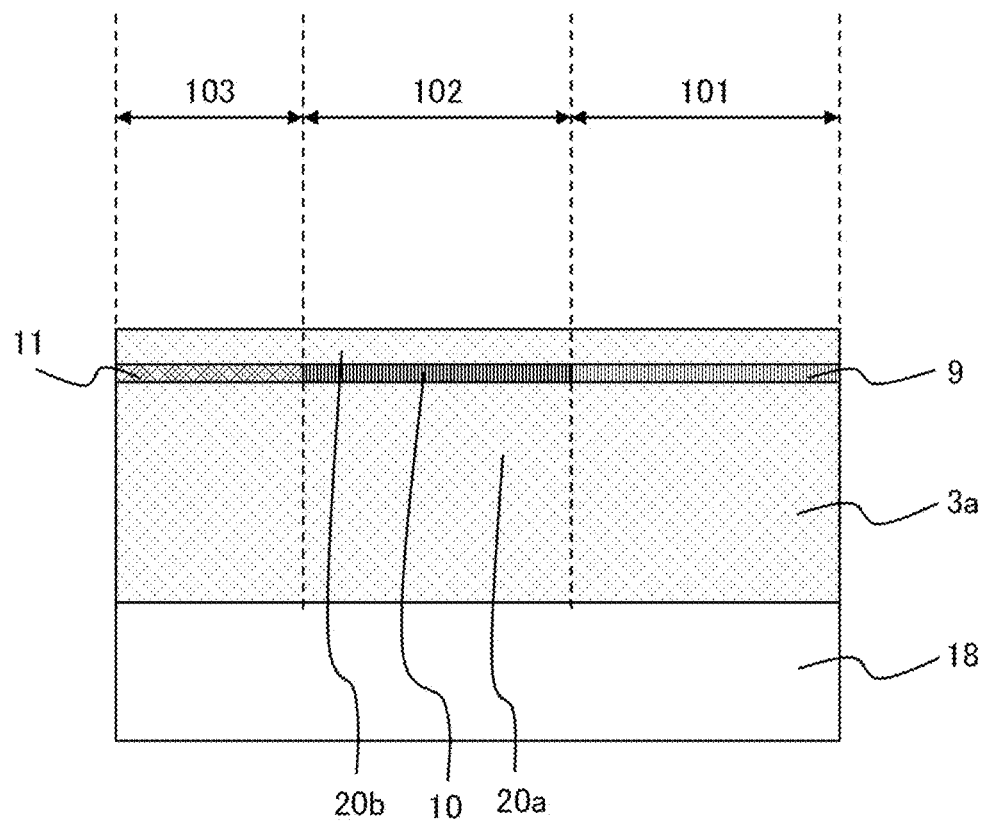
FIG. 8 is a cross-sectional view illustrating a method of manufacturing a semiconductor laser according to Embodiment 1

In addition, as illustrated in FIG. 8, a back surface side cladding layer 20*b* is formed through crystal growth. The back surface side cladding layer 20*b* is made of a crystalline material same as that of the back surface side cladding layer 20*a* and is a remnant of the back surface side cladding layer 20*a*.

Figure 9:
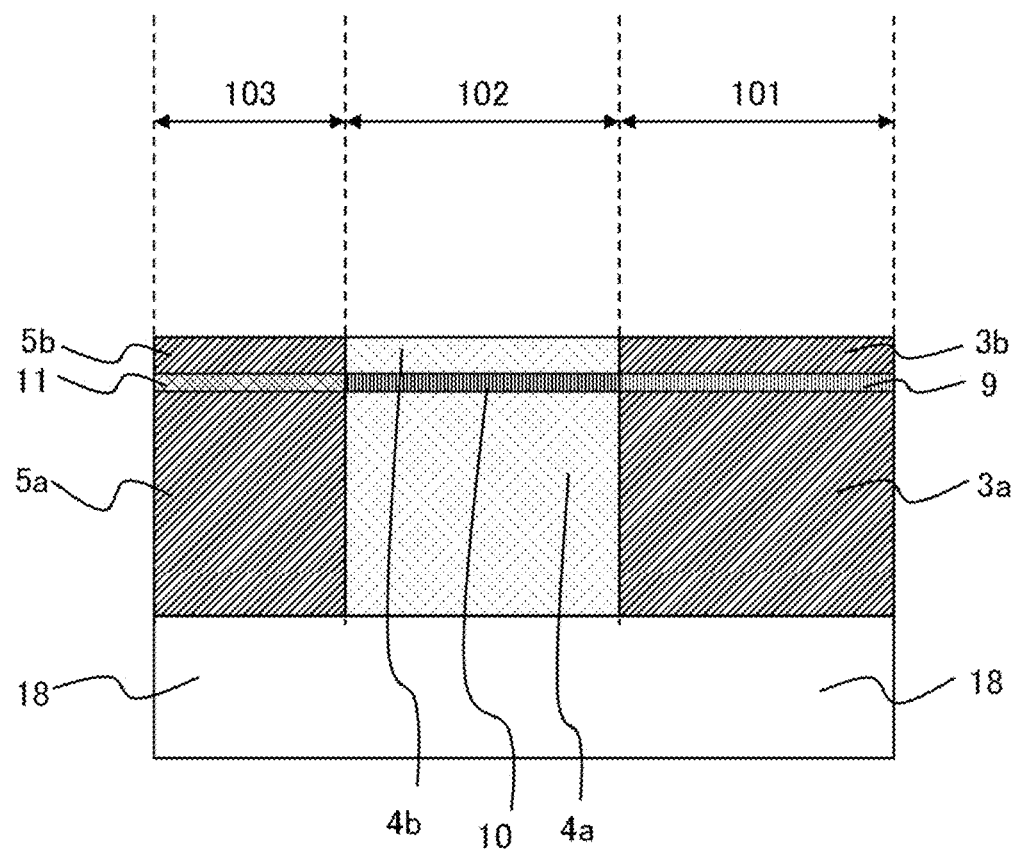
FIG. 9 is a cross-sectional view illustrating a method of manufacturing a semiconductor laser according to Embodiment 1

Thereafter, as illustrated in FIG. 9, carriers are injected into the back surface side cladding layers 20*a* and 20*b* of the DFB unit 101 and the PD unit 103 to form the back surface side first cladding layer 3*a* and the back surface side first cladding layer 3*b* of the DFB unit 101 and the back surface side third cladding layer 5*a* and the back surface side third cladding layer 5*b* of the PD unit 103, these cladding layers being of the first conductivity type. In FIG. 9, the back surface side cladding layers 20*a* and 20*b* of the DBR unit 102 correspond to the back surface side second cladding layer 4*a* and the back surface side second cladding layer 4*b*, respectively, in the device structure.

The back surface side first cladding layer 3*a* and the back surface side first cladding layer 3*b* of the DFB unit 101 are made of a same crystalline material.

The back surface side third cladding layer 5*a* and the back surface side third cladding layer 5*b* of the PD unit 103 are made of a same crystalline material.

The back surface side second cladding layer 4*a* and the back surface side second cladding layer 4*b* of the DBR unit 102 are made of a same crystalline material and have resistivities higher than those of the back surface side cladding layers of the DFB unit 101 and the PD unit 103 into which carriers are injected.

Figure 10:
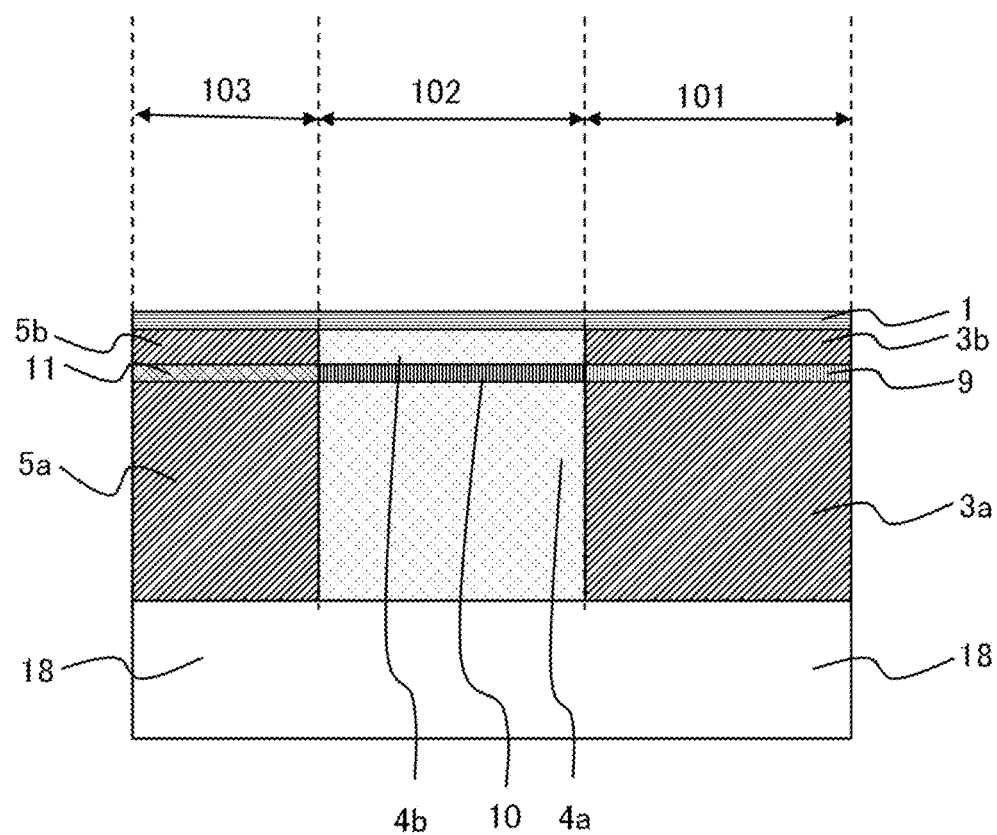
FIG. 10 is a cross-sectional view illustrating a method of manufacturing a semiconductor laser according to Embodiment 1
Figure 11:
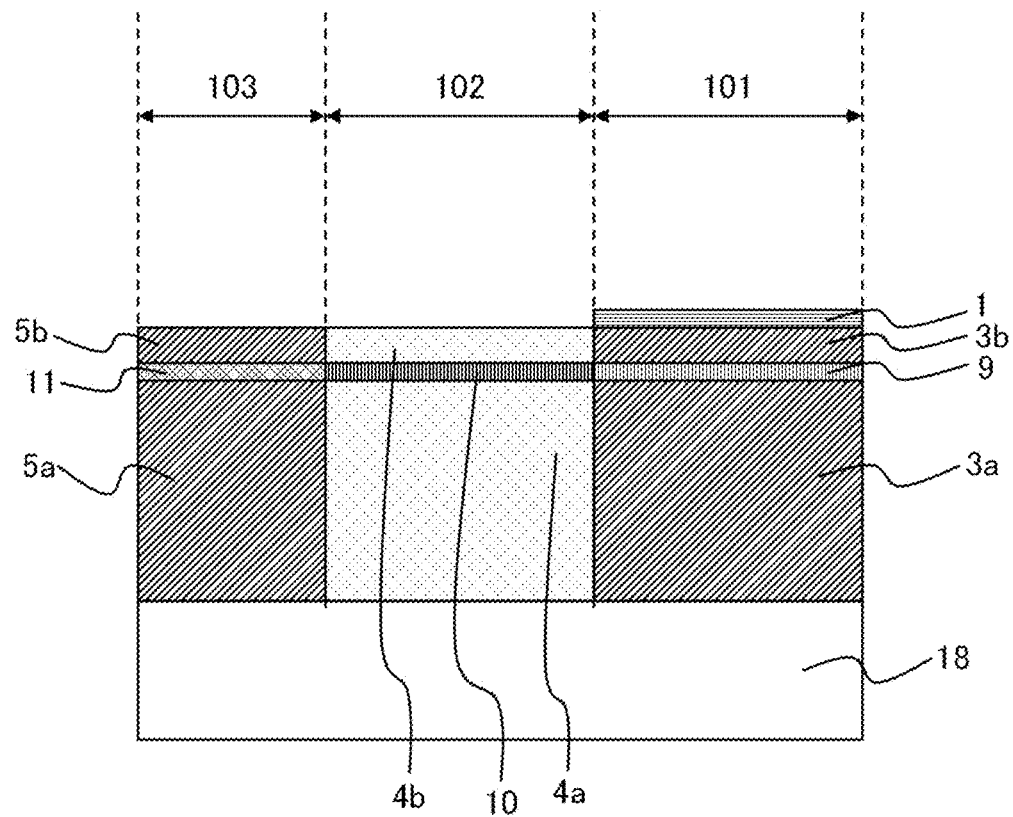
FIG. 11 is a cross-sectional view illustrating a method of manufacturing a semiconductor laser according to Embodiment 1
Figure 12:
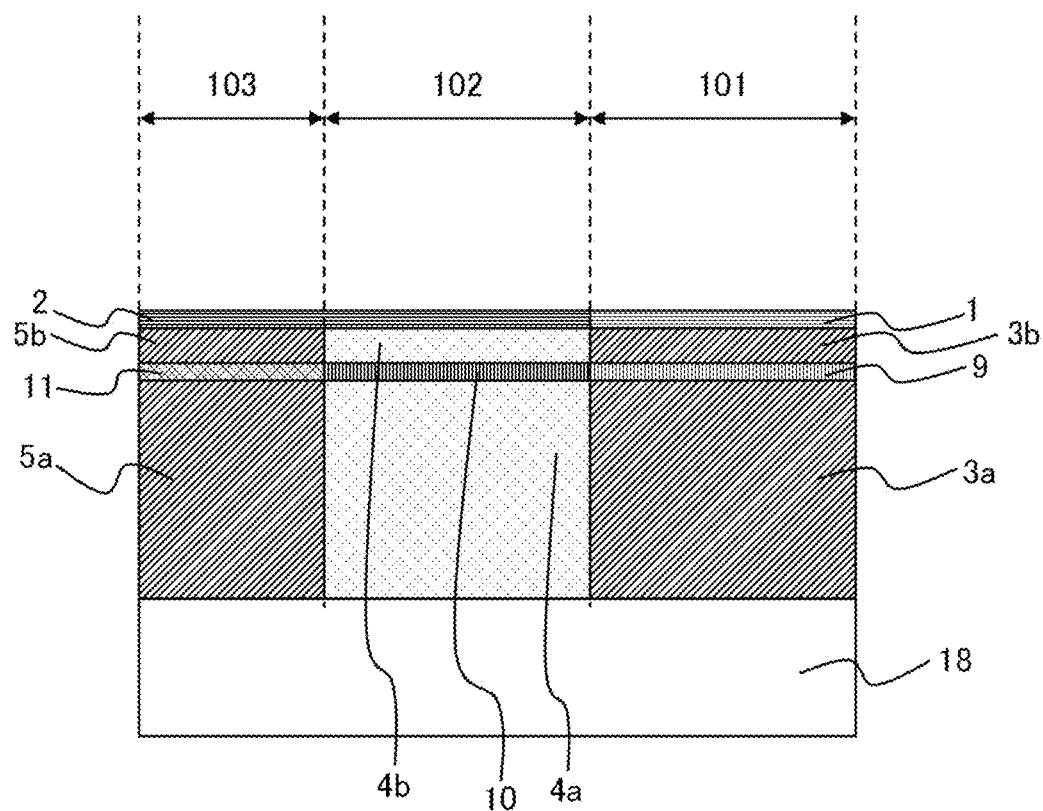
FIG. 12 is a cross-sectional view illustrating a method of manufacturing a semiconductor laser according to Embodiment 1

Subsequently, the light emitting layer 1 is stacked through crystal growth as illustrated in FIG. 10, part of the light emitting layer 1 in the PD unit 103 and the DBR unit 102 is removed through fabrication as illustrated in FIG. 11, and then the core layer 2 in the PD unit 103 and the DBR unit 102 is formed through crystal growth in a region from which the light emitting layer 1 is removed as illustrated in FIG. 12. For example, dry etching is used as the method of removing the light emitting layer 1. The core layer 2 is the first core layer 2*a* of the DBR unit 102 and the second core layer 2*b* of the PD unit 103 in the device structure.

Figure 13:
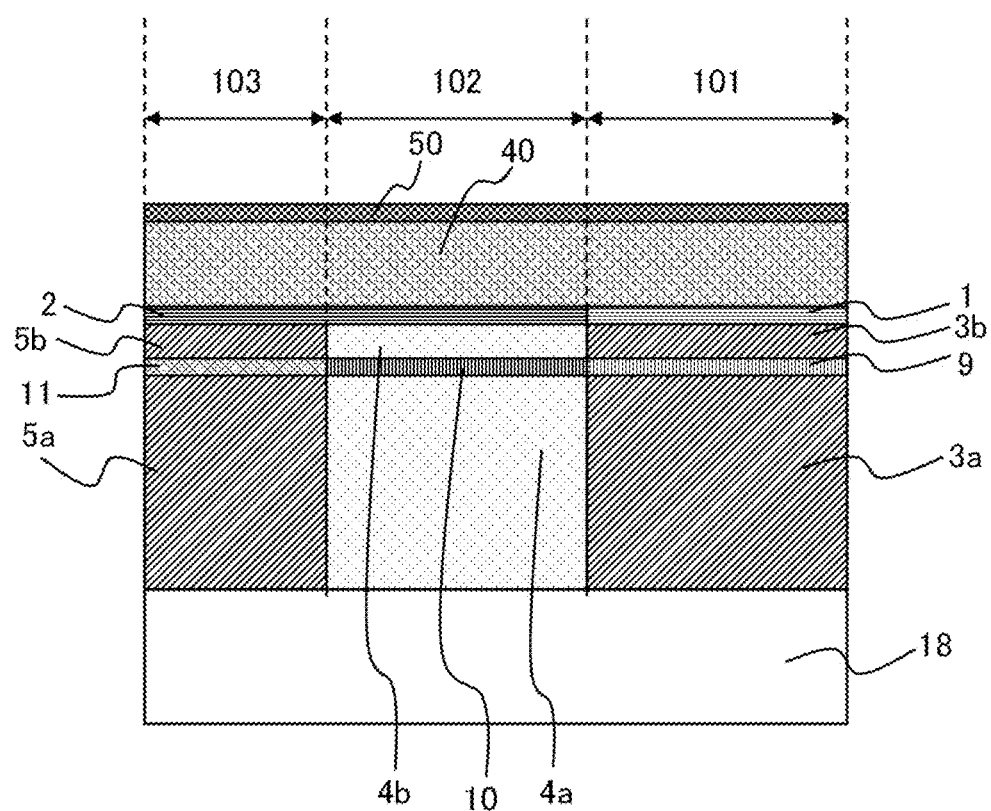
FIG. 13 is a cross-sectional view illustrating a method of manufacturing a semiconductor laser according to Embodiment 1

Subsequently, as illustrated in FIG. 13, a front surface side cladding layer 40 and a contact layer 50 are sequentially formed on the light emitting layer 1 and the core layer 2 through crystal growth.

Figure 14:
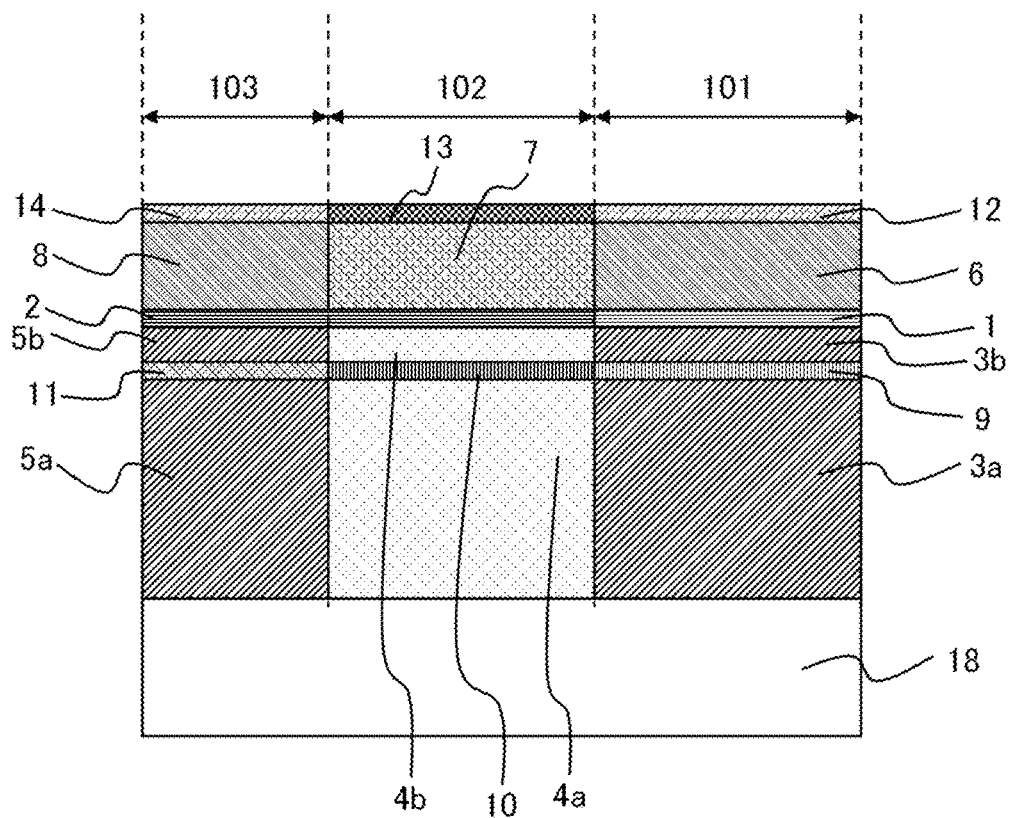
FIG. 14 is a cross-sectional view illustrating a method of manufacturing a semiconductor laser according to Embodiment 1

Subsequently, as illustrated in FIG. 14, carriers are injected into the front surface side cladding layer 40 and the contact layer 50 in the DFB unit 101 and the PD unit 103 to form the front surface side first cladding layer 6 and the first contact layer 12 of the DFB unit 101 and the front surface side third cladding layer 8 and the third contact layer 14 of the PD unit 103, these cladding layers being of the second conductivity type. Instead of the carrier injection, a region of the injection may be removed through etching fabrication and the front surface side first cladding layer 6 and the front surface side third cladding layer 8 may be formed through crystal growth.

The front surface side cladding layer 40 and the contact layer 50 in the DBR unit 102 correspond to the front surface side second cladding layer 7 and the second contact layer 13, respectively, in the device structure. The front surface side second cladding layer 7 and the second contact layer 13 of the DBR unit 102 have resistivities higher than those of a front surface side cladding layer 8 and a contact layer 14 of the DFB unit 101 and the PD unit 103 into which carriers are injected.

Subsequently, as illustrated in FIGS. 2, 3, and 4, which are diagrams illustrating sectional structures orthogonal to the waveguide direction, the front surface side first cladding layer 6 and the first contact layer 12 on the light emitting layer 1 in the DFB unit 101, the front surface side second cladding layer 7 and the second contact layer 13 on the core layer 2 in the DBR unit 102, and the front surface side third cladding layer 8 and the third contact layer 14 on the core layer 2 in the PD unit 103 are fabricated into ridge waveguide structures. For example, dry etching is used as the method of the fabrication.

The front surface side first cladding layer 6 on the light emitting layer 1 in the DFB unit 101, the front surface side second cladding layer 7 on the core layer 2 in the DBR unit 102, and the front surface side third cladding layer 8 on the core layer 2 in the PD unit 103 may be incompletely removed with the front surface side third cladding layer 8 partially remaining.

Figure 15:
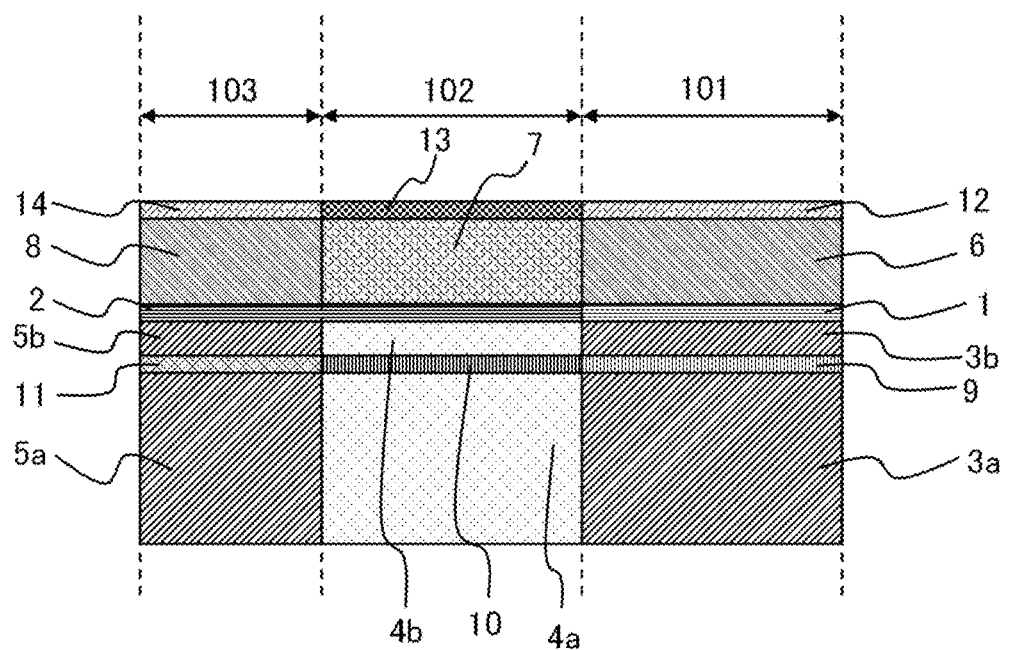
FIG. 15 is a cross-sectional view illustrating a method of manufacturing a semiconductor laser according to Embodiment 1
Figure 16:
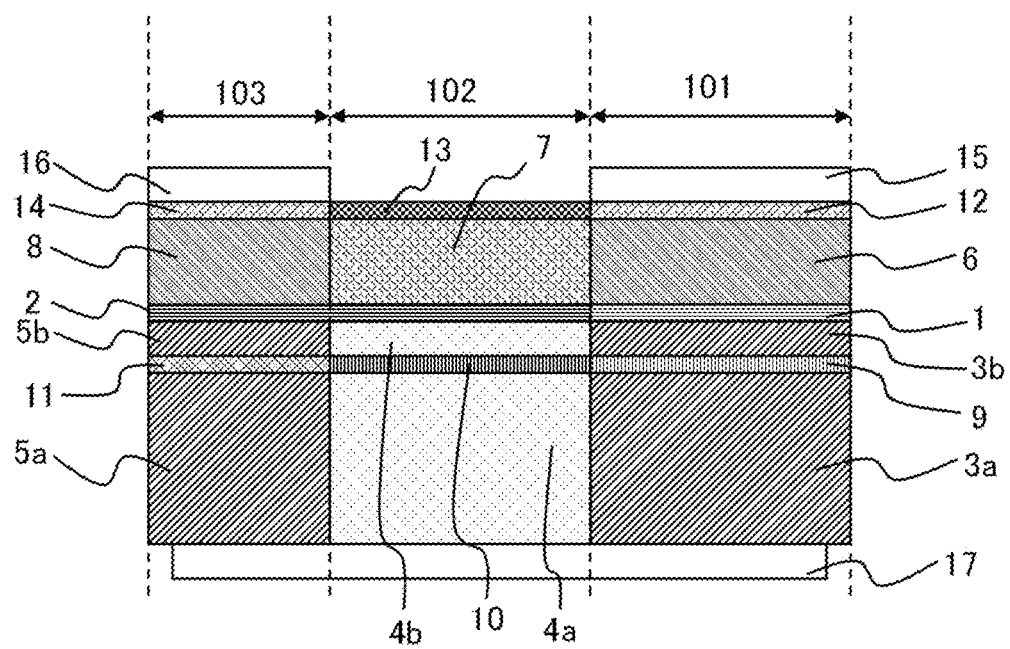
FIG. 16 is a cross-sectional view illustrating a method of manufacturing a semiconductor laser according to Embodiment 1

Thereafter, as illustrated in FIG. 15, the entire substrate 18 on the back surface side is removed by grinding, and then as illustrated in FIG. 16, the front surface side first electrode 15 and the front surface side second electrode 16 are formed on the first contact layer 12 of the DFB unit 101 and on the third contact layer 14 of the PD unit 103, respectively, and in addition, the back surface side electrode 17 is formed on an exposed surface. For example, a metal evaporation method is used as the method of the electrode formation.

The above-described process of manufacturing the semiconductor laser according to Embodiment 1, which is performed only through stack formation for uniform thickness distribution and etching fabrication for constant depth distribution, is a highly reproducible manufacturing method and thus can manufacture the semiconductor laser according to Embodiment 1 at high yield.

Figure 17:
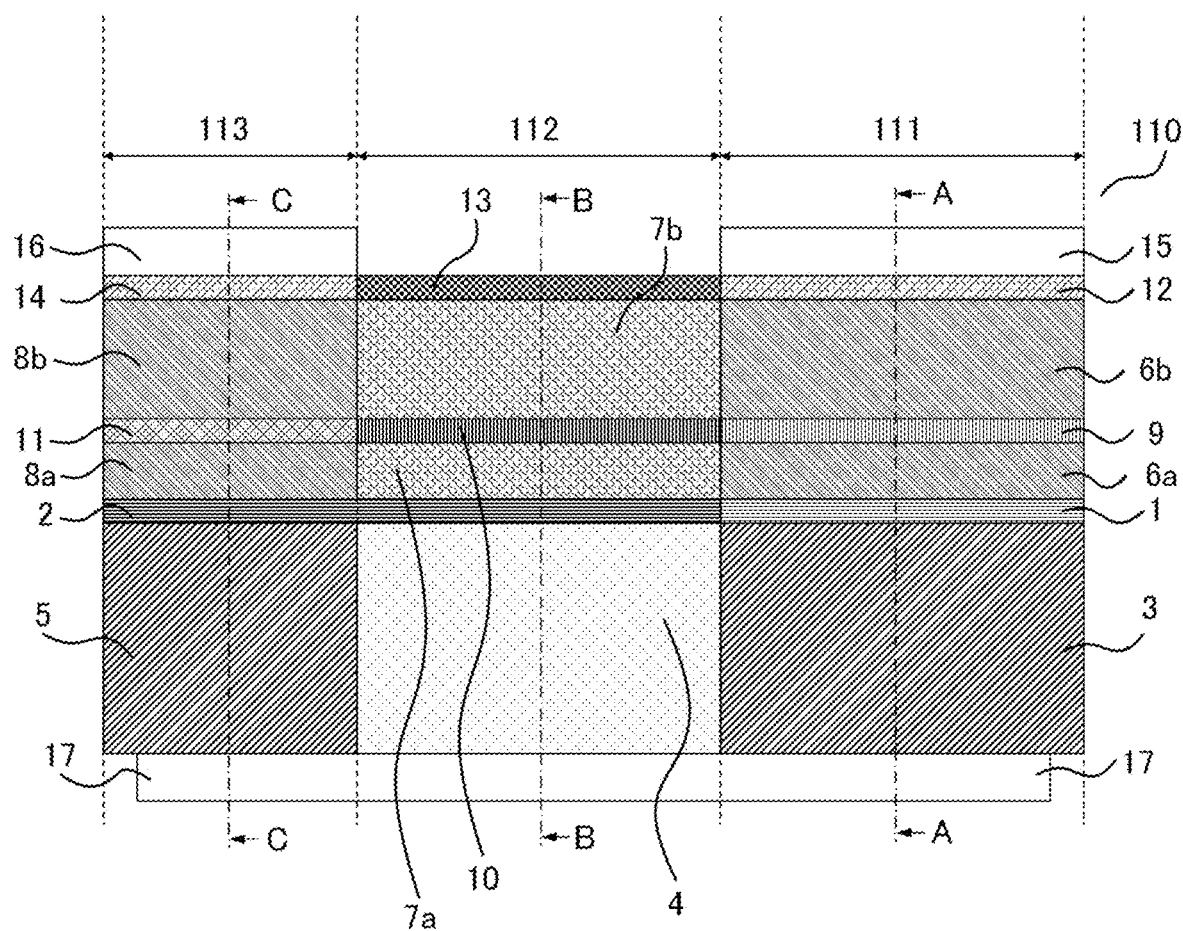
FIG. 17 is a cross-sectional view of a configuration of a semiconductor laser according to a modification of Embodiment 1.
Figure 18:
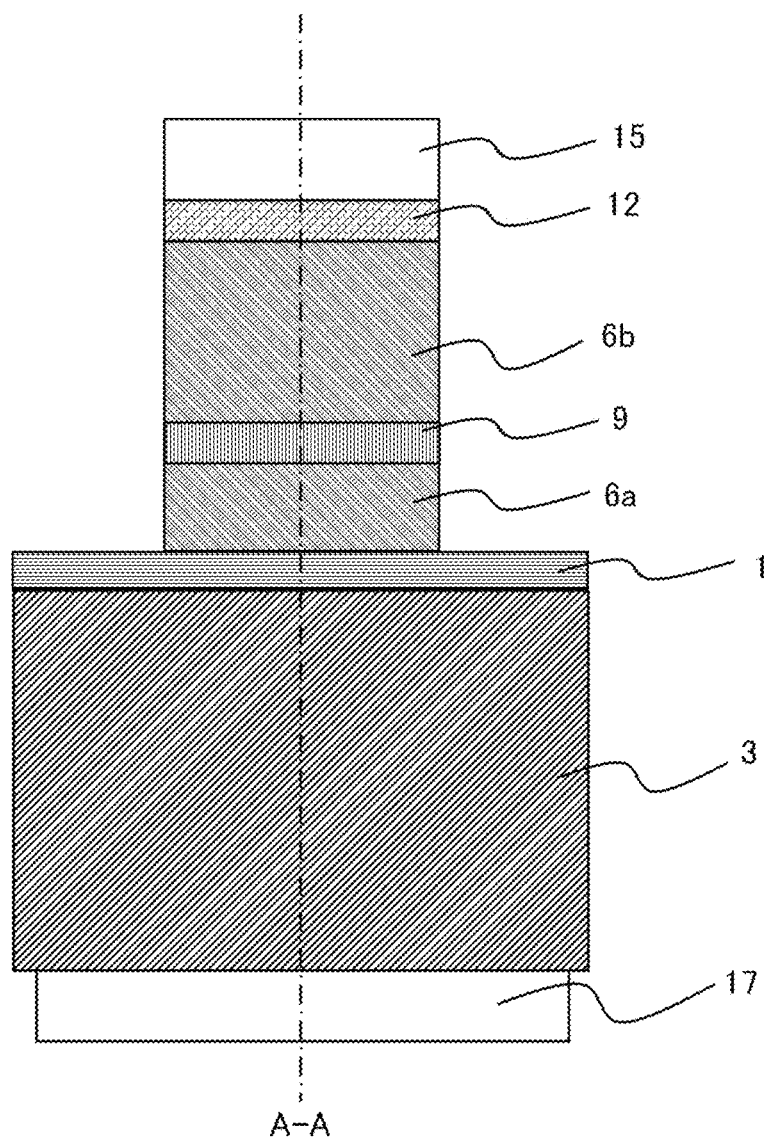
FIG. 18 is a cross-sectional view of a ridge waveguide structure of a DFB unit of a semiconductor laser according to a modification of Embodiment 1.
Figure 19:
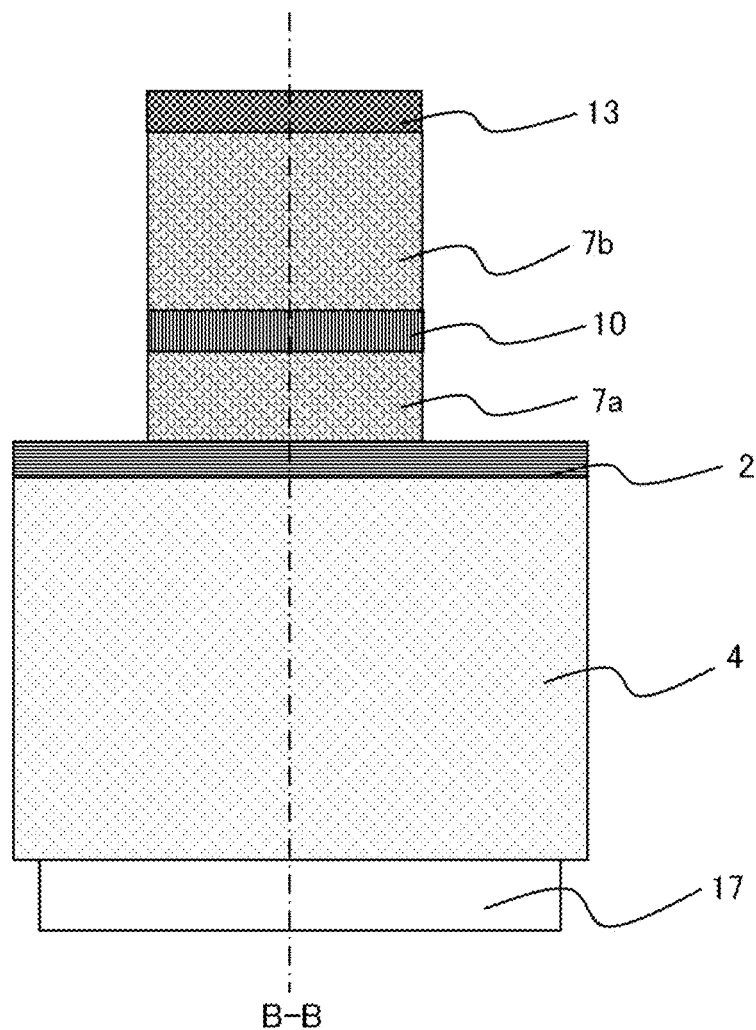
FIG. 19 is a cross-sectional view of a ridge waveguide structure of a DBR unit of a semiconductor laser according to a modification of Embodiment 1.
Figure 20:
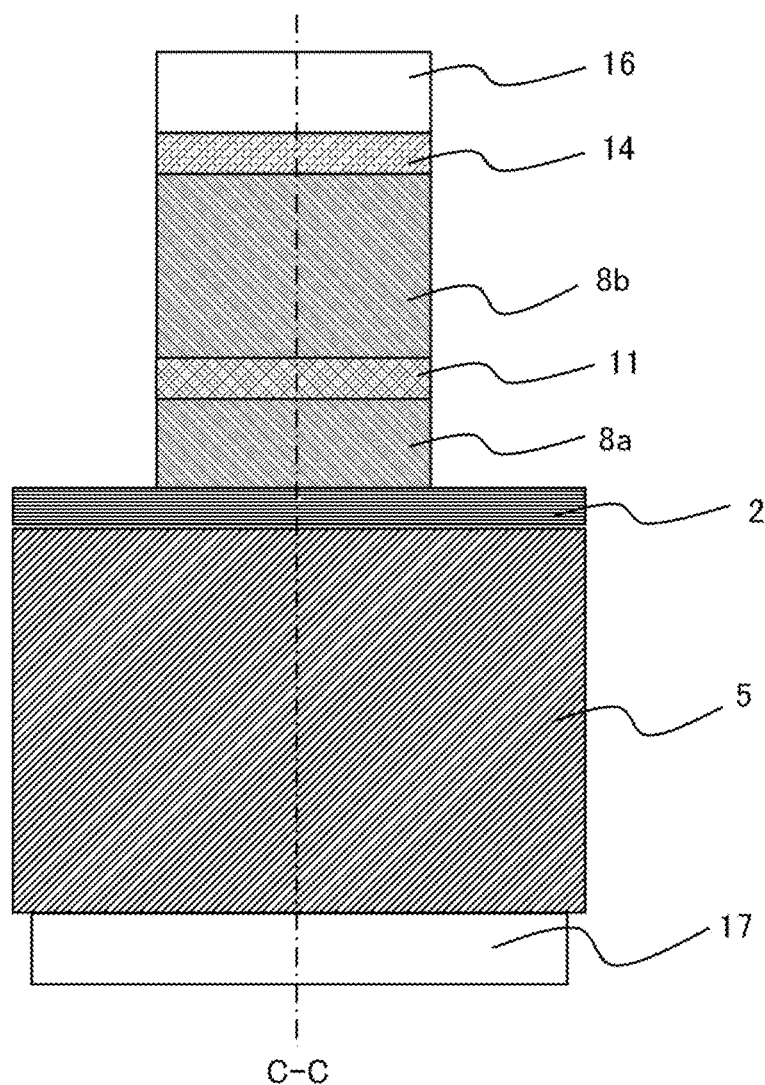
FIG. 20 is a cross-sectional view of a ridge waveguide structure of a PD unit of a semiconductor laser according to a modification of Embodiment 1.

The following describes a semiconductor laser 110 as a modification of Embodiment 1 with reference to FIG. 17. As for sectional structures of a DFB unit 111, a DBR unit 112, and a PD unit 113 of the semiconductor laser 110 as the modification of Embodiment 1 in the direction orthogonal to the waveguide direction, a section of the DFB unit 111 is illustrated in FIG. 18, a section of the DBR unit 112 is illustrated in FIG. 19, and a section of the PD unit 113 is illustrated in FIG. 20.

When, as illustrated in FIG. 17, the first diffraction grating layer 9 of the DFB unit 111 is sandwiched between a front surface side first cladding layer 6a and the front surface side first cladding layer 6a, and the second diffraction grating layer 10 of the DBR unit 112 is sandwiched between a front surface side second cladding layer 7a and a front surface side second cladding layer 7b, the semiconductor laser 110 can be manufactured through processes below.

Figure 21:
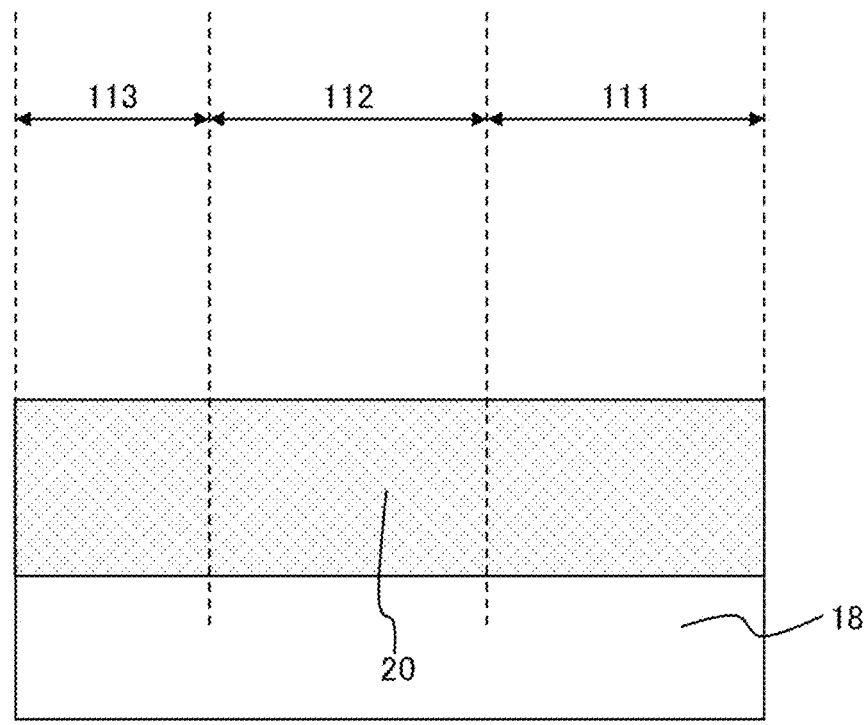
FIG. 21 is a cross-sectional view illustrating a method of manufacturing a semiconductor laser according to a modification of Embodiment 1
Figure 22:
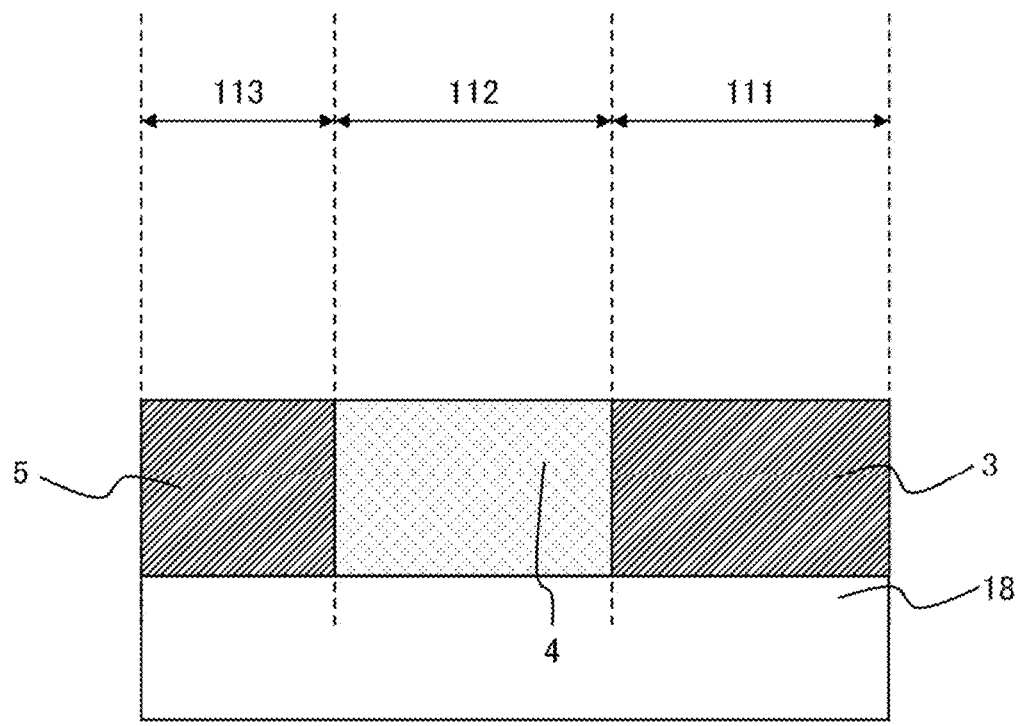
FIG. 22 is a cross-sectional view illustrating a method of manufacturing a semiconductor laser according to a modification of Embodiment 1

First, similarly to Embodiment 1, as illustrated in FIG. 21, a back surface side cladding layer 20 is formed on the substrate 18 illustrated in FIG. 5 through crystal growth. Subsequently, as illustrated in FIG. 22, carriers are injected into parts of the back surface side cladding layer 20 in the DFB unit 111 and the PD unit 113 to form a back surface side first cladding layer 3 of the DFB unit 111 and a back surface side third cladding layer 5 of the PD unit 113. Instead of the carrier injection, a region of the injection may be removed through etching fabrication, and the back surface side first cladding layer 3 and the back surface side third cladding layer 5 may be formed through crystal growth.

The back surface side cladding layer 20 of the DBR unit 102 corresponds to a back surface side second cladding layer 4 in the device structure. The back surface side second cladding layer 4 of the DBR unit 102 has a resistivity higher than those of the back surface side cladding layers of the DFB unit 101 and the PD unit 103.

Figure 23:
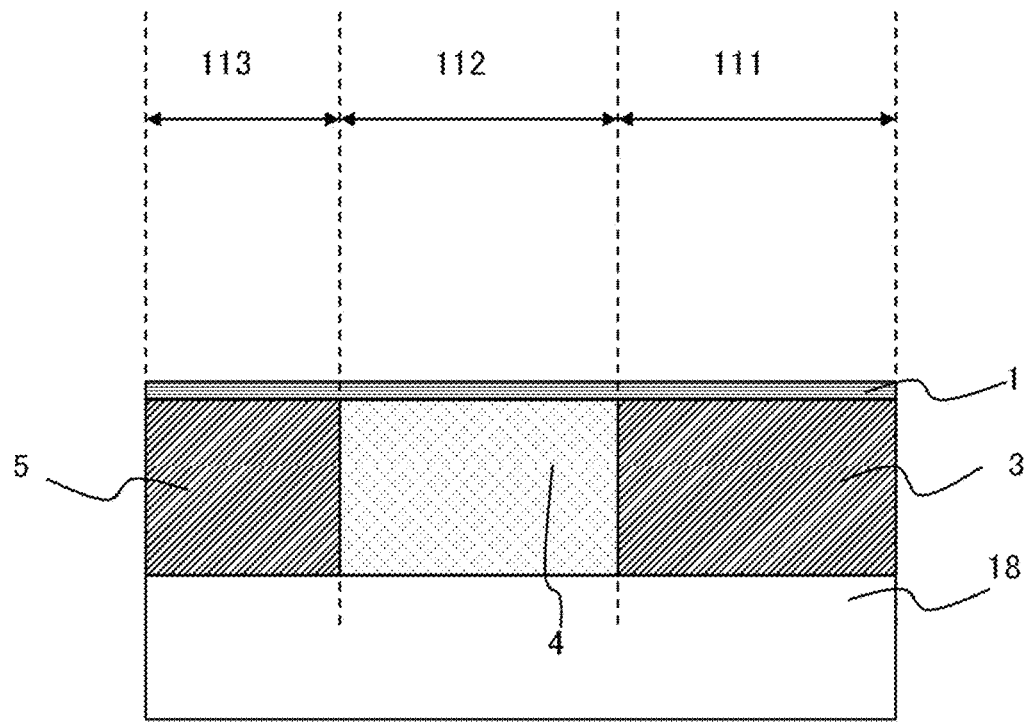
FIG. 23 is a cross-sectional view illustrating a method of manufacturing a semiconductor laser according to a modification of Embodiment 1
Figure 24:
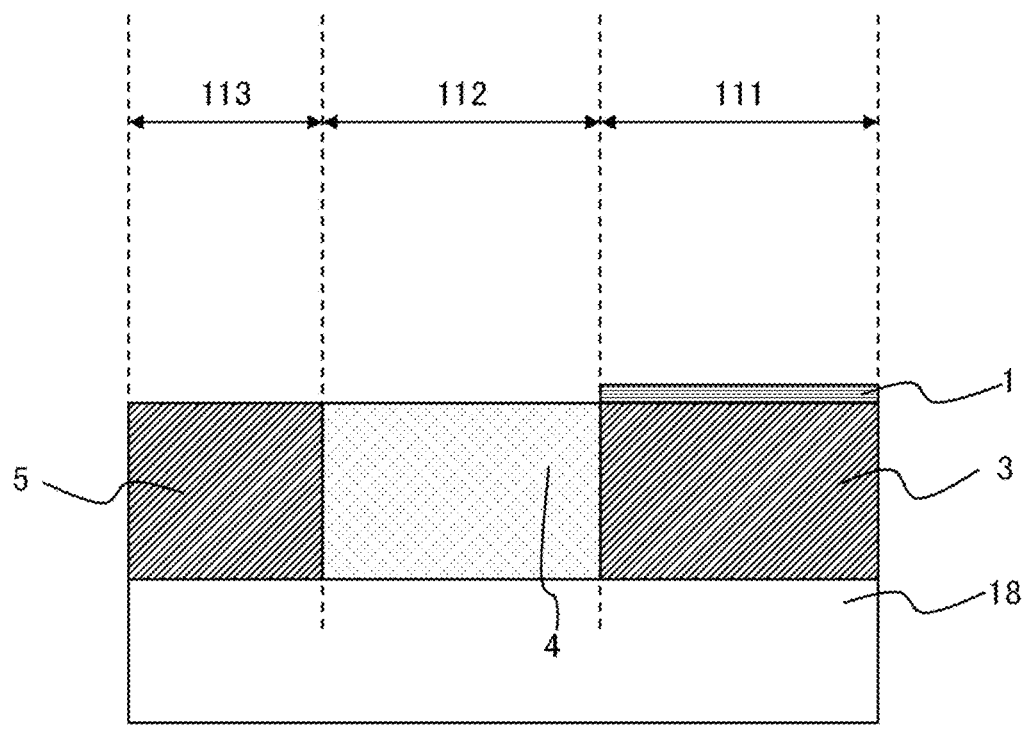
FIG. 24 is a cross-sectional view illustrating a method of manufacturing a semiconductor laser according to a modification of Embodiment 1
Figure 25:
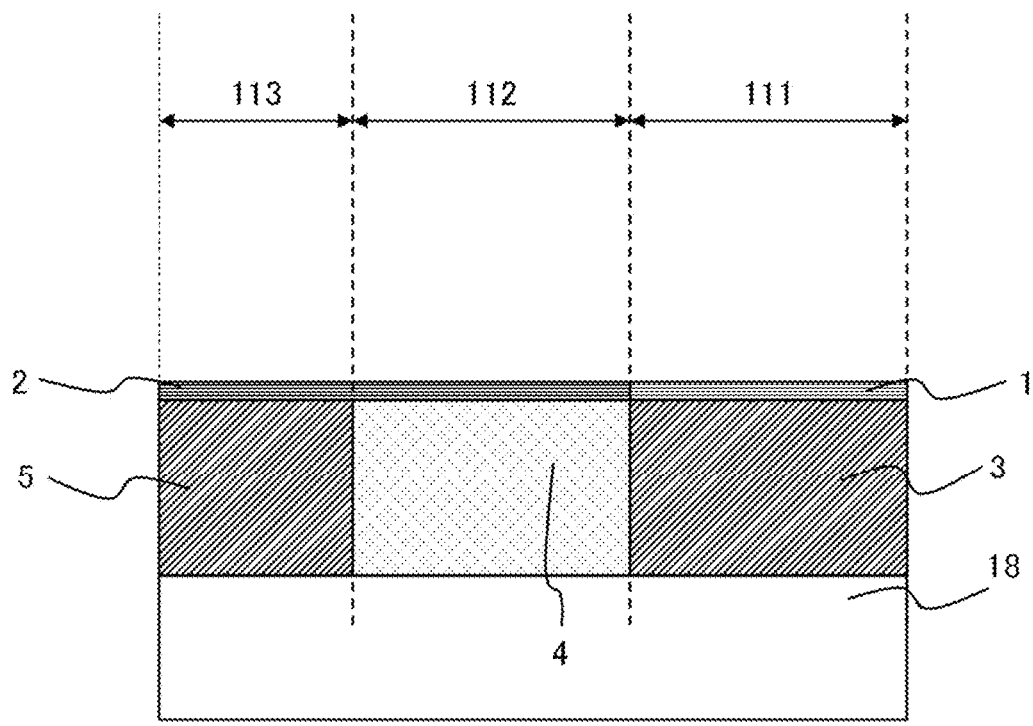
FIG. 25 is a cross-sectional view illustrating a method of manufacturing a semiconductor laser according to a modification of Embodiment 1

After the above-described process, the light emitting layer 1 is formed through crystal growth as illustrated in FIG. 23, parts of the light emitting layer 1 in the PD unit 113 and the DBR unit 112 are removed through etching fabrication as illustrated in FIG. 24, and then the core layer 2 in the DBR unit 102 and the PD unit 103 is formed through crystal growth in a region from which the light emitting layer 1 is removed as illustrated in FIG. 25. For example, dry etching is used as the method of removing the light emitting layer 1. The core layer 2 is the first core layer 2a of the DBR unit 102 and the second core layer 2b of the PD unit 103 in the device structure.

Figure 26:
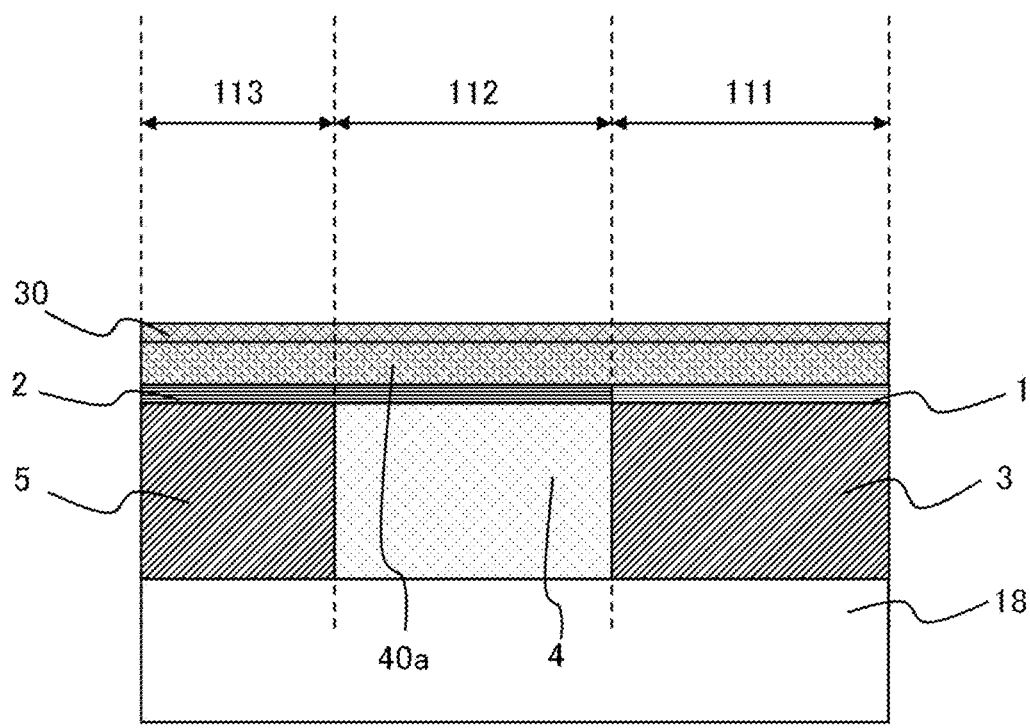
FIG. 26 is a cross-sectional view illustrating a method of manufacturing a semiconductor laser according to a modification of Embodiment 1

Subsequently, as illustrated in FIG. 26, a front surface side cladding layer 40a and the cladding layer 30 are sequentially formed on the light emitting layer 1, the first core layer 2a, and the second core layer 2b. The front surface side cladding layer 40a and the cladding layer 30 are high-resistivity layers made of crystalline materials different from each other.

Figure 27:
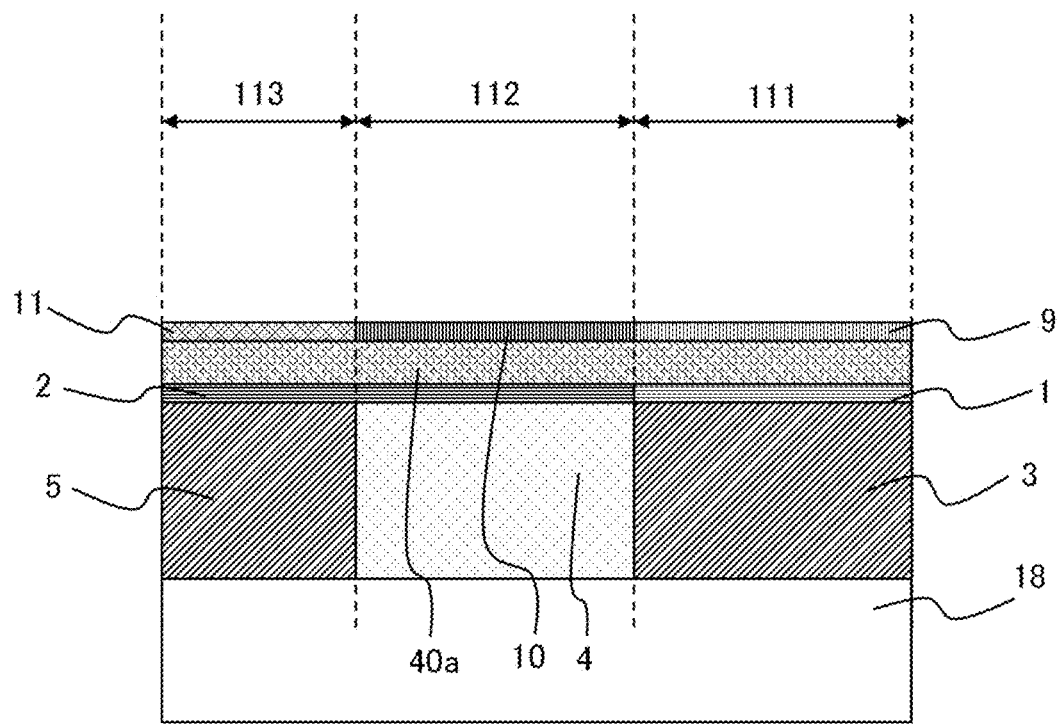
FIG. 27 is a cross-sectional view illustrating a method of manufacturing a semiconductor laser according to a modification of Embodiment 1

Subsequently, as illustrated in FIG. 27, part of the cladding layer 30 is fabricated in a diffraction grating pattern to form the first diffraction grating layer 9 of the DFB unit 101 and the second diffraction grating layer 10 of the DBR unit 102. The cladding layer 30 of the PD unit 103 corresponds to the fourth cladding layer 11 in the device structure.

Figure 28:
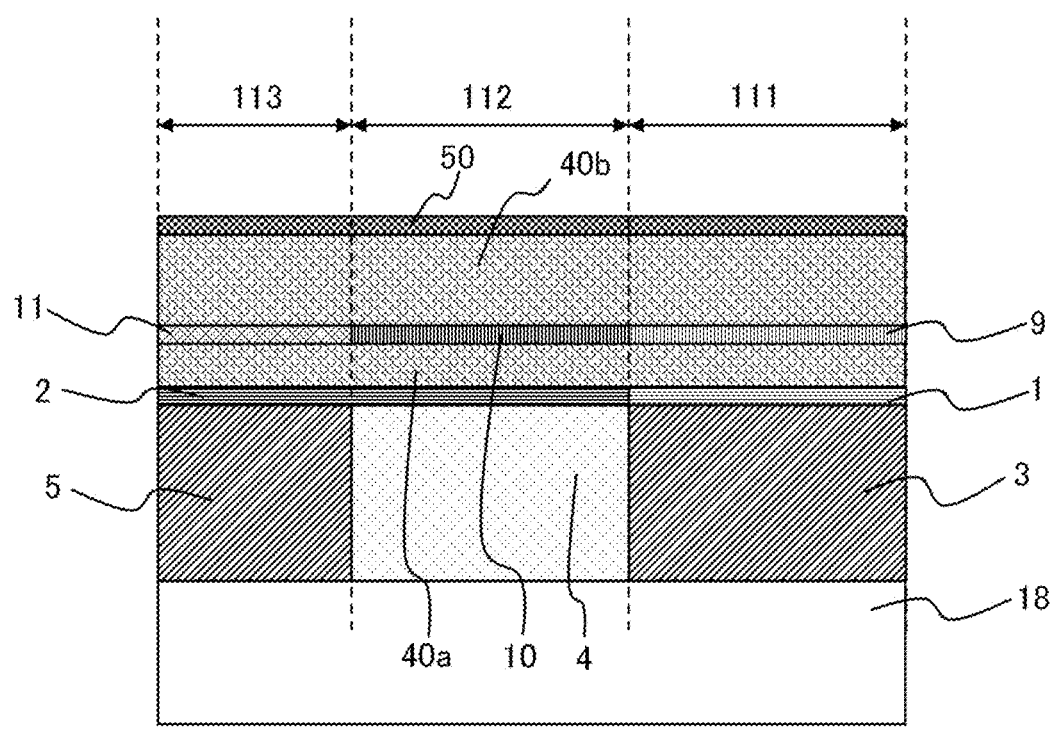
FIG. 28 is a cross-sectional view illustrating a method of manufacturing a semiconductor laser according to a modification of Embodiment 1

Subsequently, as illustrated in FIG. 28, a front surface side cladding layer 40b and the contact layer 50 are sequentially formed through crystal growth.

Figure 29:
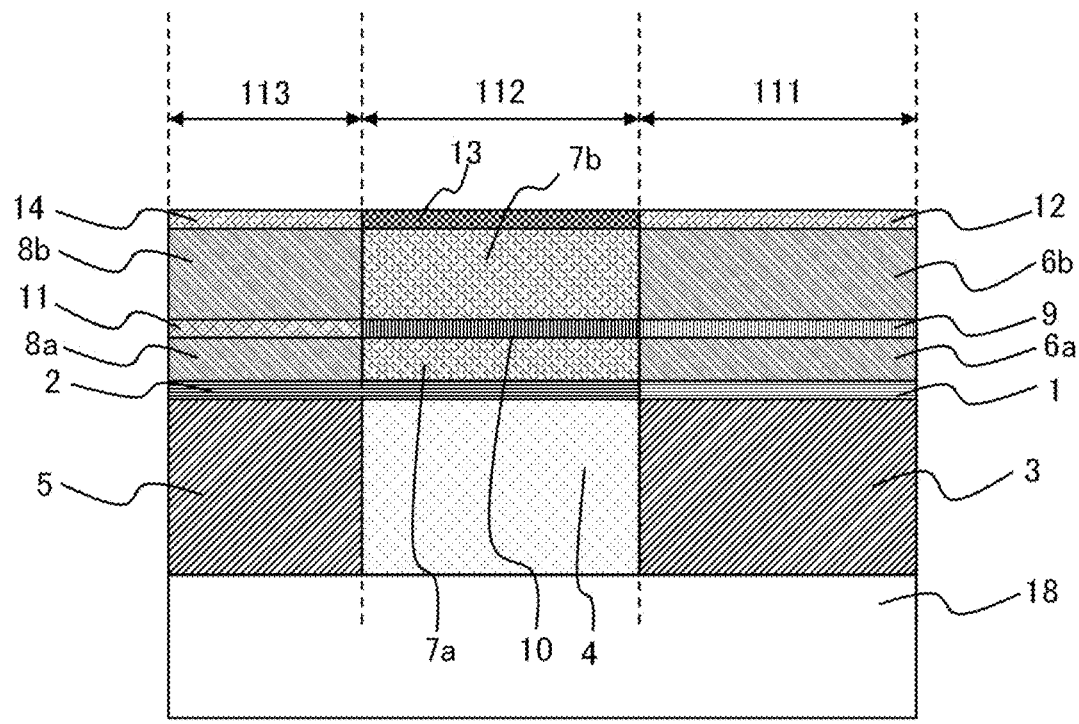
FIG. 29 is a cross-sectional view illustrating a method of manufacturing a semiconductor laser according to a modification of Embodiment 1

As illustrated in FIG. 29, carriers are injected into the front surface side cladding layer 40a, the front surface side cladding layer 40b, and the contact layer 50 in the DFB unit 111 and the PD unit 113 to form the front surface side first cladding layers 6a and 6b and the first contact layer 12 of the DFB unit 111, and front surface side third cladding layers 8a and 8b and the third contact layer 14 of the PD unit 113.

The front surface side cladding layer 40a, the front surface side cladding layer 40b, and the contact layer 50 in the DBR unit 102 correspond to the front surface side second cladding layer 7a, the front surface side second cladding layer 7b, and the second contact layer 13, respectively, in the device structure.

The front surface side first cladding layer 6a and the front surface side first cladding layer 6b of the DFB unit 101 are made of a same crystalline material.

The front surface side third cladding layer 8a and the front surface side third cladding layer 8b of the PD unit 103 are made of a same crystalline material.

The front surface side second cladding layer 7a and the front surface side second cladding layer 7b of the DBR unit 102 are made of a same crystalline material. The front surface side second cladding layer 7a, the front surface side second cladding layer 7b, and the second contact layer 13 of the DBR unit 102 have resistivities higher than those of the front surface side cladding layers and contact layers of the DFB unit 101 and the PD unit 103.

Subsequently, as illustrated in FIGS. 18, 19, and 20, which are diagrams illustrating sectional structures in the direction orthogonal to the waveguide direction, the front surface side first cladding layer 6a, the first diffraction grating layer 9, the front surface side first cladding layer 6b, and the first contact layer 12 on the light emitting layer 1 in the DFB unit 111, the front surface side second cladding layer 7a, the second diffraction grating layer 10, the front surface side second cladding layer 7b, and the second contact layer 13 on the core layer 2 in the DBR unit 112, and the front surface side third cladding layer 8a, the fourth cladding layer 11, the front surface side third cladding layer 8b, and the third contact layer 14 on the core layer 2 in the PD unit 113 are fabricated into ridge waveguide structures. For example, dry etching is used as the method of the fabrication.

Figure 30:
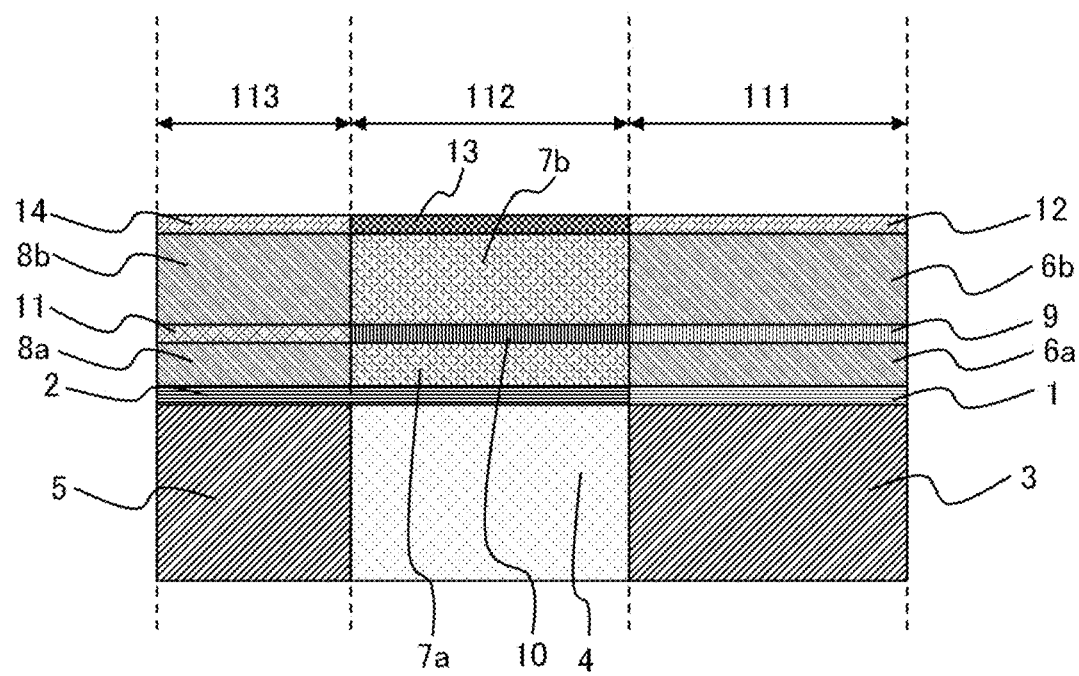
FIG. 30 is a cross-sectional view illustrating a method of manufacturing a semiconductor laser according to a modification of Embodiment 1
Figure 31:
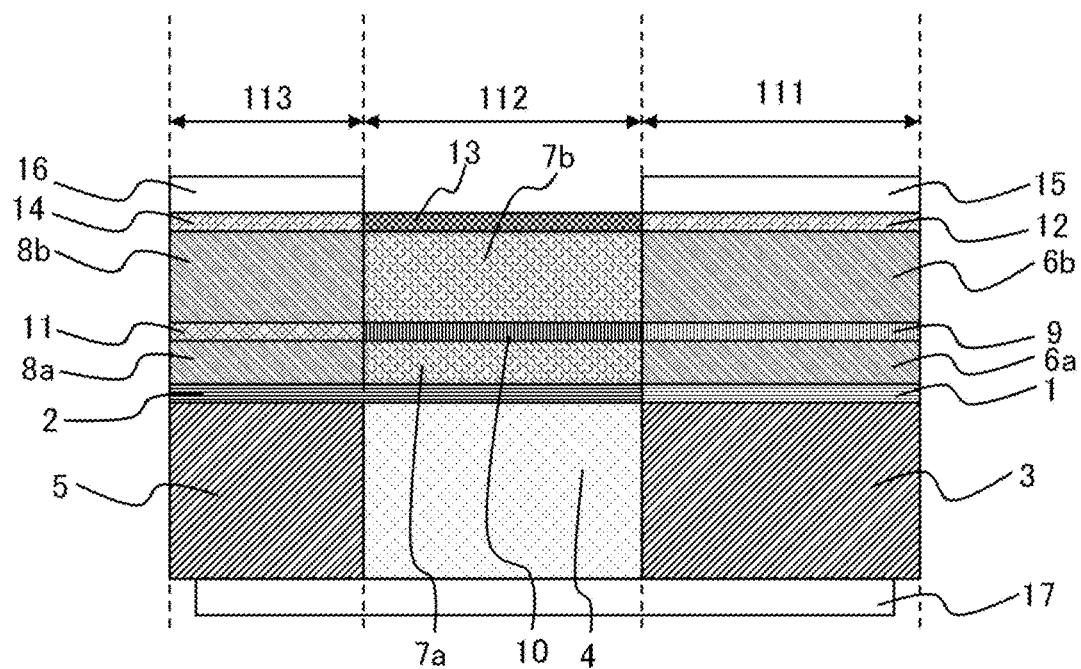
FIG. 31 is a cross-sectional view illustrating a method of manufacturing a semiconductor laser according to a modification of Embodiment 1

Thereafter, as illustrated in FIG. 30, the substrate 18 on the back surface side is removed by grinding, and then as illustrated in FIG. 31, the front surface side first electrode 15 and the front surface side second electrode 16 are formed on the front surface side in the DFB unit 111 and on the front surface side in the PD unit 113, respectively, and in addition, the back surface side electrode 17 is formed on the entire back surface side. For example, a metal evaporation method is used as the method of the electrode formation.

The above-described manufacturing method can manufacture the semiconductor laser 110 as the modification of Embodiment 1 having a configuration in which the first diffraction grating layer 9 is positioned between the front surface side first cladding layer 6a and the front surface side first cladding layer 6b and the second diffraction grating layer 10 is positioned between the front surface side second cladding layer 7a and the front surface side second cladding layer 7b.

With the above-described configuration, in the semiconductor laser 100 according to Embodiment 1 of the present invention, output change of a laser beam emitted from the DFB unit 101 can be measured as change of a current amount detected by the PD unit 103, and the light emitting layer 1 in the DFB unit 101 and the second core layer 2b in the PD unit 103 independently operate and thus can each have an optimum layer configuration. Thus, the light emitting layer 1 in the DFB unit 101 is not affected by change of the second MQW structure of the second core layer 2b in the PD unit 103 so that the second core layer 2b, which receives a laser beam in the PD unit 103, can easily detect a small laser beam output. Conversely, operation at the PD unit 103 is not affected by change of the first MQW structure of the light emitting layer 1 due to improvement of characteristics of the DFB unit 101 or the like.

Since the front surface side second cladding layer 7 and the back surface side second cladding layer 4 of the DBR unit 102 are cladding layers having resistivities higher than those of the cladding layers of the DFB unit 101 and the PD unit 103, a current path between the DFB unit 101 and the PD unit 103 as described in PTL 1 can be extremely effectively prevented. Specifically, a current path from the front surface side first electrode 15 of the DFB unit 101 to the back surface side electrode 17 through the DBR unit 102 (path of current flowing through the front surface side first electrode 15, the first contact layer 12, and the front surface side first cladding layer 6 of the DFB unit 101, the front surface side second cladding layer 7 of the DBR unit 102, and the front surface side third cladding layer 8, the first core layer 2a, the back surface side third cladding layer 5b, the fourth cladding layer 11, the back surface side third cladding layer 5a, and the back surface side electrode 17 of the PD unit 103 in the stated order) can be blocked by the front surface side second cladding layer 7 having a high resistivity in the DBR unit 102.

Similarly, a current path from the back surface side electrode 17 to the front surface side second electrode 16 of the PD unit 103 through the DBR unit 102 (path of current flowing through the back surface side electrode 17, the back surface side first cladding layer 3a of the DFB unit 101, the back surface side second cladding layer 4a of the DBR unit 102, and the back surface side third cladding layer 5a, the fourth cladding layer 11, the back surface side third cladding layer 5b, the first core layer 2a, the front surface side third cladding layer 8, the third contact layer 14, and the front surface side second electrode 16 of the PD unit 103 in the stated order) can be prevented by the high resistivity of the back surface side second cladding layer 4a of the DBR unit 102. Accordingly, current flowing in the PD unit 103 does not merge with current in the DFB unit 101 and does not affect the laser beam output, and thus optical output adjustment can be performed only by the value of current applied to the DFB unit 101.

Embodiment 1 of the present invention achieves the same effects for a configuration in which the first diffraction grating layer 9 is positioned between the front surface side first cladding layer 6a and the front surface side first cladding layer 6b and the second diffraction grating layer 10 is positioned between the front surface side second cladding layer 7a and the front surface side second cladding layer 7b as in the modification of Embodiment 1 illustrated in FIG. 17.

Embodiment 2

In the semiconductor laser according to Embodiment 1, a sectional structure in the direction orthogonal to the waveguide direction is a ridge waveguide structure. Setting of an optimum layer configuration independently for each of the light emitting layer and the core layer and independent operation of each of the DFB unit and the PD unit, which are the effects achieved by the present invention, are possible with the sectional structures in the waveguide direction, which are illustrated in FIGS. 1 and 17. Thus, a sectional structure in the direction orthogonal to the waveguide direction is not limited to a ridge waveguide structure.

Figure 32:
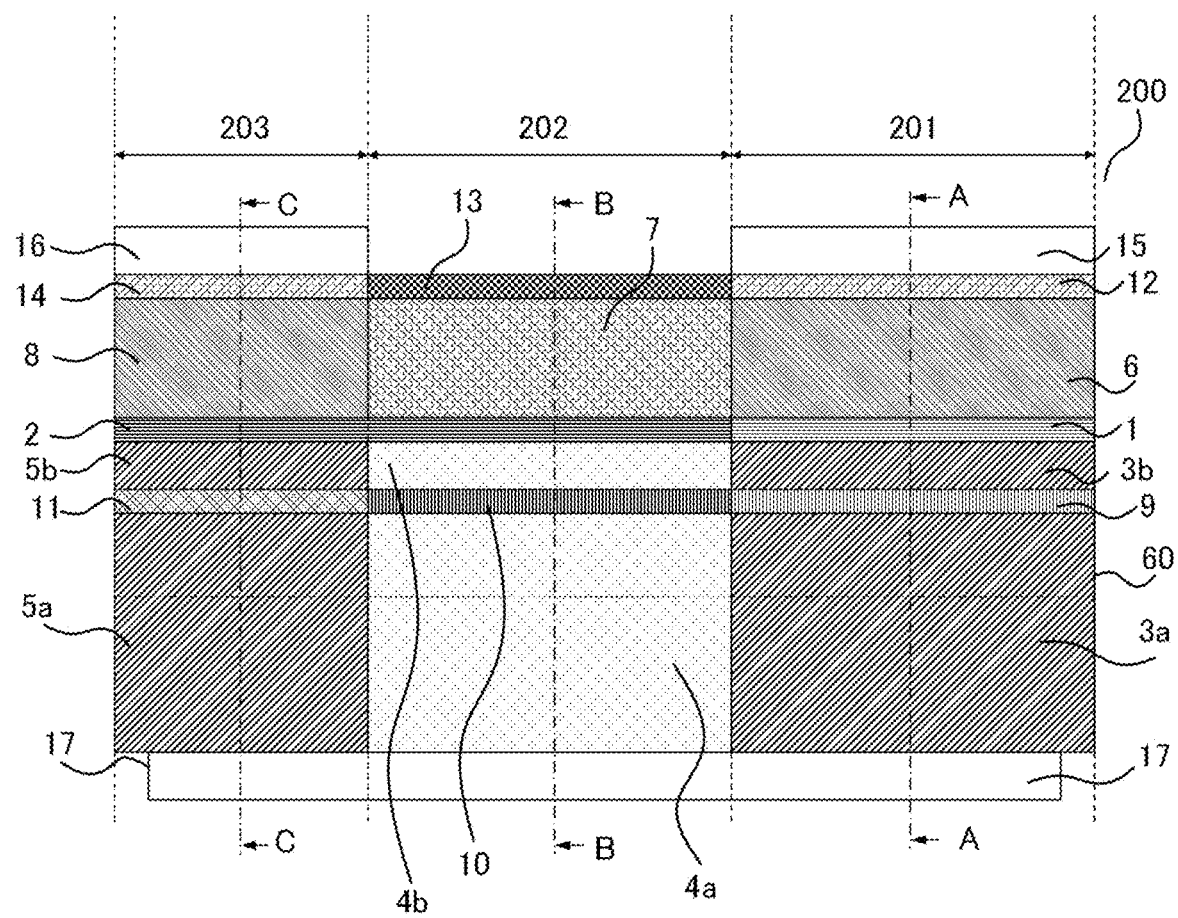
FIG. 32 is a cross-sectional view of a configuration of a semiconductor laser according to Embodiment 2.

FIG. 32 illustrates a sectional structure of a semiconductor laser 200 according to Embodiment 2 in the waveguide direction. The sectional structure of the semiconductor laser 200 in the waveguide direction is same as that in FIG. 1, but the sectional structure thereof in the direction orthogonal to the waveguide direction is different from the ridge waveguide structure illustrated in FIGS. 2 to 4. As described later, a high mesa interface 60 is provided halfway through the back surface side first cladding layer 3a.

Figure 33:
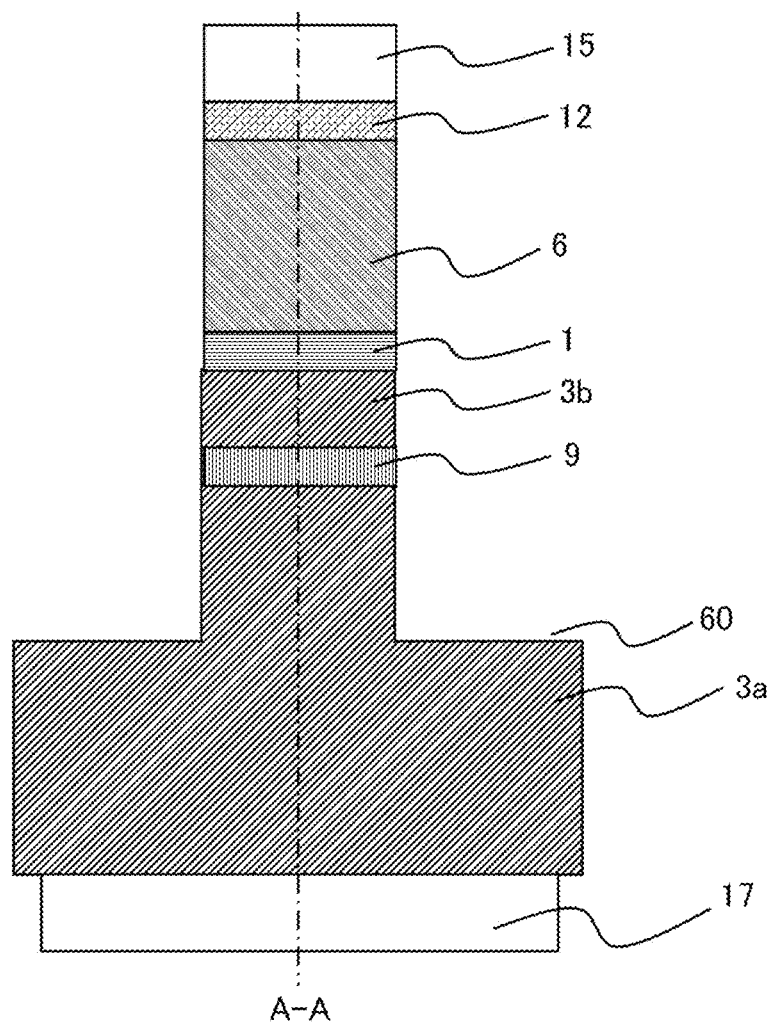
FIG. 33 is a cross-sectional view of a high-mesa waveguide structure of a DFB unit of a semiconductor laser according to Embodiment 2.
Figure 34:
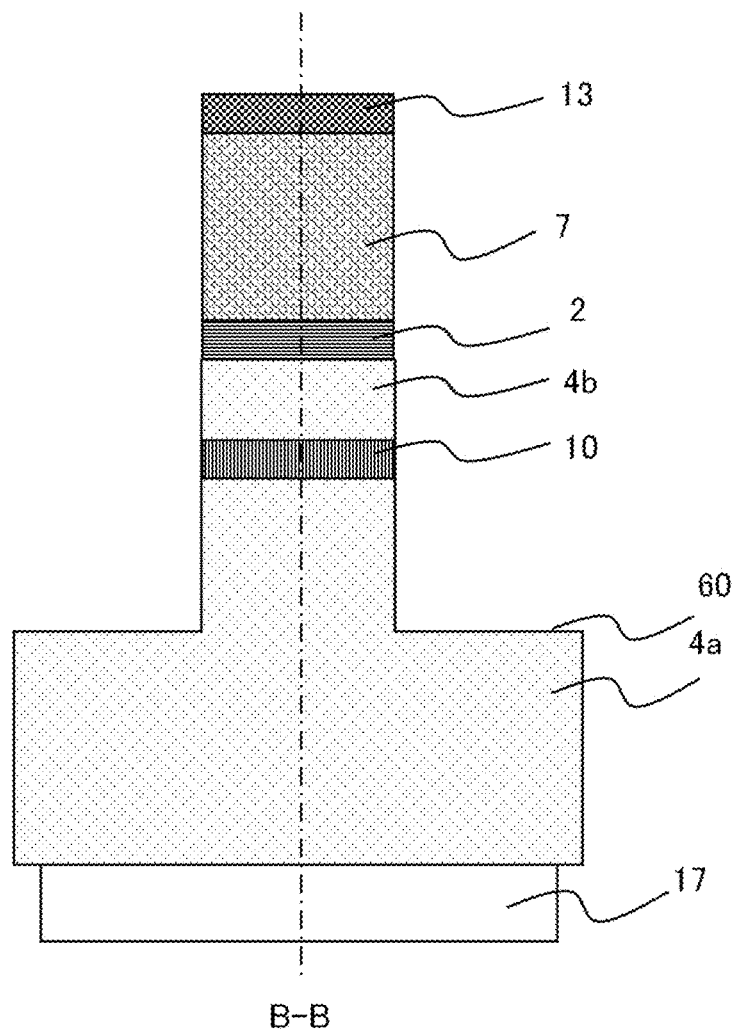
FIG. 34 is a cross-sectional view of a high-mesa waveguide structure of a DBR unit of a semiconductor laser according to Embodiment 2.
Figure 35:
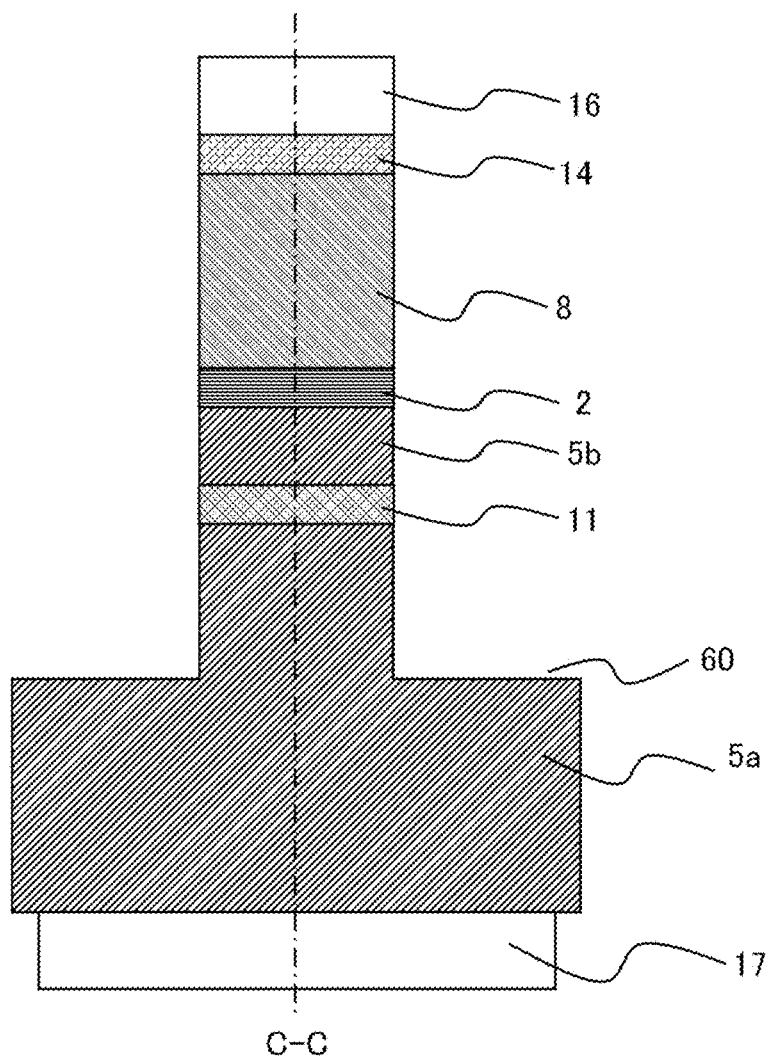
FIG. 35 is a cross-sectional view of a high-mesa waveguide structure of a PD unit of a semiconductor laser according to Embodiment 2.

As for the sectional structure of the semiconductor laser 200 according to Embodiment 2 in the direction orthogonal to the waveguide direction, a section of a DFB unit 201 is illustrated in FIG. 33, a section of a DBR unit 202 is illustrated in FIG. 34, and a section of a PD unit 203 is illustrated in FIG. 35.

The sectional structure of the semiconductor laser 200 according to Embodiment 2 in the direction orthogonal to the waveguide direction is a high-mesa waveguide structure in which fabrication is provided from the front surface side to part of the back surface side first cladding layer 3a (the position of the high mesa interface 60) as illustrated in FIGS. 33, 34, and 35. In FIGS. 33 to 35, a component denoted by a reference sign same as that in FIG. 1 is an identical or corresponding component.

Specifically, in the section of the DFB unit 201 in the direction orthogonal to the waveguide direction illustrated in FIG. 33, the layers of the front surface side first electrode 15, the first contact layer 12, the front surface side first cladding layer 6, the light emitting layer 1, the back surface side first cladding layer 3b, the first diffraction grating layer 9, and part of the back surface side first cladding layer 3a (the position of the high mesa interface 60) from the front surface to the back surface are fabricated into the high-mesa waveguide structure. The conduction type of each layer is same as that in Embodiment 1.

In the section of the DBR unit 202 in the direction orthogonal to the waveguide direction illustrated in FIG. 34, the layers of the second contact layer 13, the front surface side second cladding layer 7, the first core layer 2a, the back surface side second cladding layer 4b, the second diffraction grating layer 10, and part of the back surface side second cladding layer 4a (the position of the high mesa interface 60) from the front surface to the back surface are fabricated into the high-mesa waveguide structure.

In the section of the PD unit 203 in the direction orthogonal to the waveguide direction illustrated in FIG. 35, the layers of the front surface side second electrode 16, the third contact layer 14, the front surface side third cladding layer 8, the second core layer 2b, the back surface side third cladding layer 5b, the fourth cladding layer 11, and part of the back surface side third cladding layer 5a (the position of the high mesa interface 60) from the front surface to the back surface are fabricated into the high-mesa waveguide structure. The conduction type of each layer is same as that in Embodiment 1.

In a method of manufacturing the semiconductor laser 200 according to Embodiment 2, the procedure corresponding to FIGS. 5 to 14 in Embodiment 1 is same, but before the process of grinding the substrate 18 on the back surface side, which is illustrated in FIG. 15, parts from the front surface side to the back surface side, namely, parts from the positions of the first contact layer 12, the second contact layer 13, and the third contact layer 14 to parts of the back surface side first cladding layer 3a, the back surface side second cladding layer 4a, and the back surface side third cladding layer 5a (the position of the high mesa interface 60) are fabricated into the high-mesa waveguide structure by dry etching. Thereafter, similarly to Embodiment 1, the substrate 18 is removed by grinding, and the front surface side first electrode 15 of the DFB unit 201, the front surface side second electrode 16 of the DBR unit 202, and the entire back surface side electrode 17 are formed. For example, a metal evaporation method is used as the method of the electrode formation.

In the semiconductor laser according to Embodiment 2 as well, output change of a laser beam emitted from the DFB unit 201 can be measured as change of a current amount detected by the PD unit 203, and the light emitting layer 1 in the DFB unit 201 and the core layer 2 in the PD unit 203 independently operate and thus can each have an optimum layer configuration. In addition, the effect of preventing a current path between the DFB unit 201 and the PD unit 203 is achieved. Moreover, since the high-mesa waveguide structure is employed, a laser beam can be more efficiently confined in the light emitting layer 1.

Embodiment 3

An embedded semiconductor laser 300 (not illustrated) according to Embodiment 3 has a sectional structure same as that in FIG. 32 in the waveguide direction.

Figure 36:
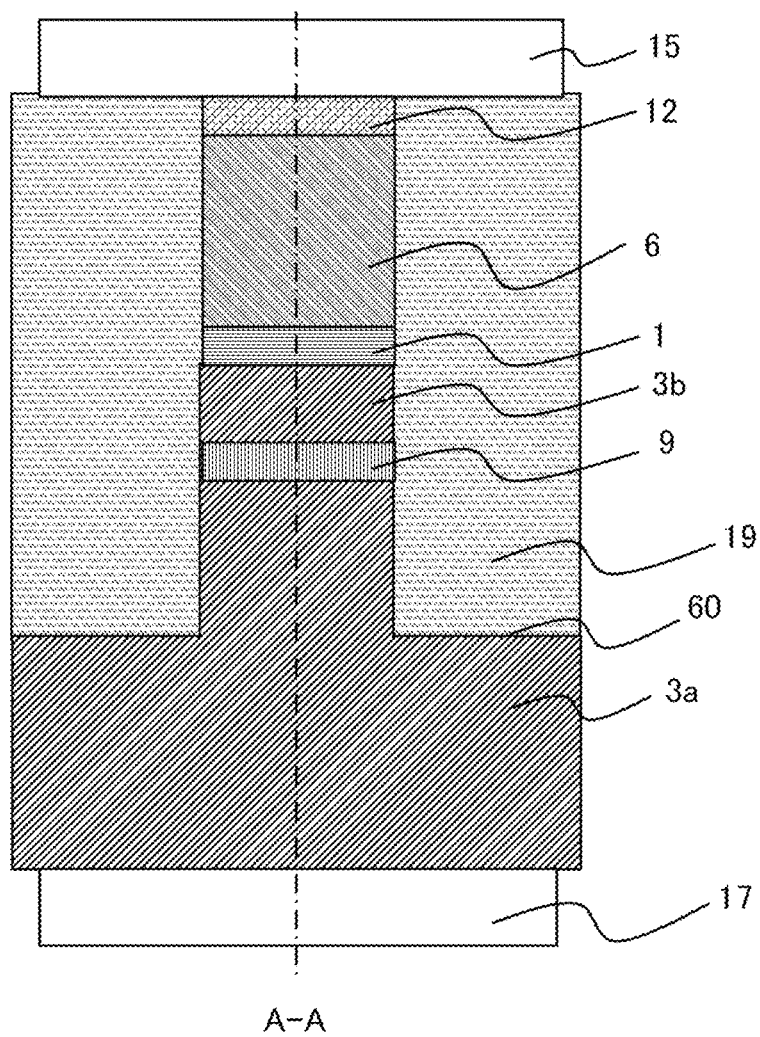
FIG. 36 is a cross-sectional view of a DFB unit of an embedded semiconductor laser according to Embodiment 3.
Figure 37:
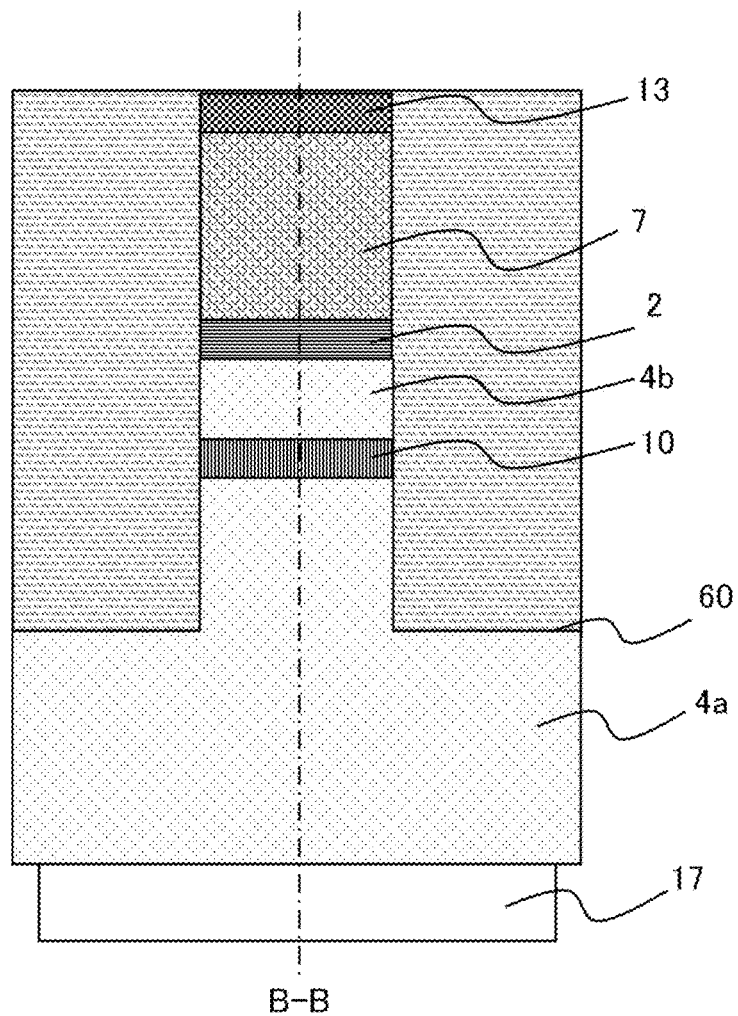
FIG. 37 is a cross-sectional view of a DBR unit of an embedded semiconductor laser according to Embodiment 3.
Figure 38:
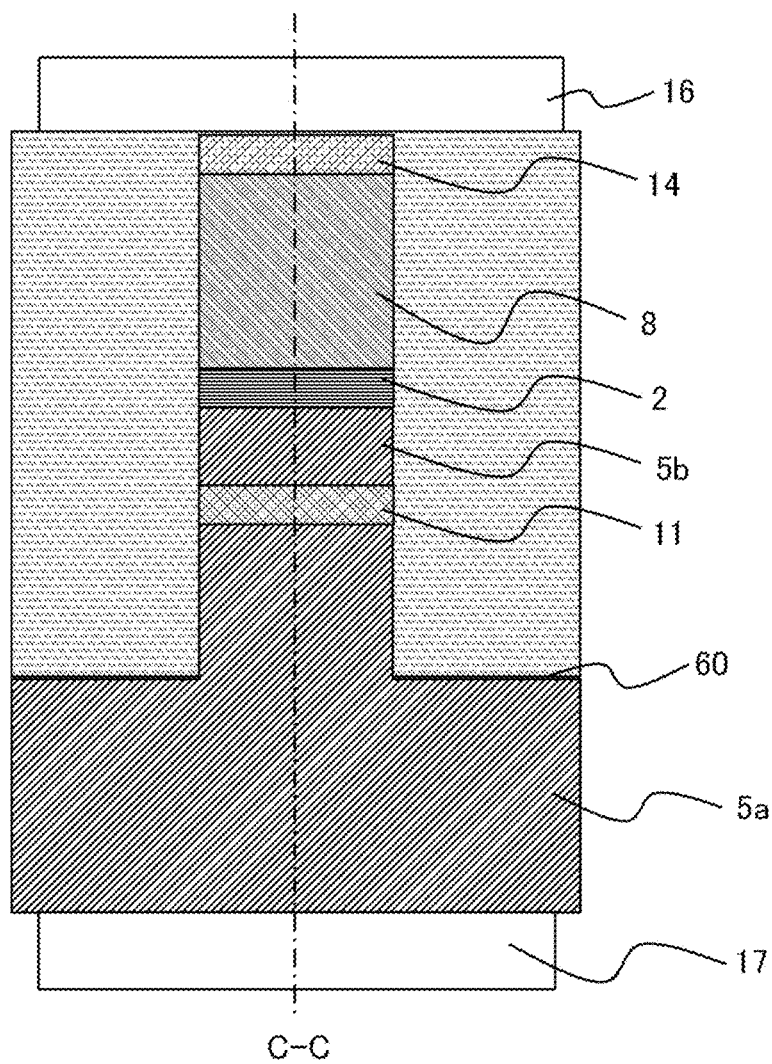
FIG. 38 is a cross-sectional view of a PD unit of an embedded semiconductor laser according to Embodiment 3.

As for the sectional structure of the embedded semiconductor laser 300 according to Embodiment 3 in the direction orthogonal to the waveguide direction, a section of a DFB unit 301 is illustrated in FIG. 36, a section of a DBR unit 302 is illustrated in FIG. 37, and a section of a PD unit 303 is illustrated in FIG. 38.

The sectional structure of the embedded semiconductor laser 300 according to Embodiment 3 in the direction orthogonal to the waveguide direction is an embedded sectional structure in which parts of the back surface side first cladding layer 3a, the back surface side second cladding layer 4a, and the back surface side third cladding layer 5a are fabricated into a high-mesa waveguide structure and a region of the fabrication is embedded with a current block layer 19 having a high resistivity as illustrated in FIGS. 36, 37, and 38.

In FIGS. 36 to 38, a component denoted by a reference sign same as that in FIG. 1 is an identical or corresponding component.

In a method of manufacturing the embedded semiconductor laser 300 according to Embodiment 3, the process of performing fabrication into the high-mesa waveguide structure up to parts of the cladding layers from the front surface to the back surface is same as that in Embodiment 2. In addition, thereafter, the fabricated region is embedded with the current block layer 19, the substrate 18 is removed by grinding, and the front surface side first electrode 15, the front surface side second electrode 16, and the back surface side electrode 17 are formed. For example, a metal evaporation method is used as the method of the electrode formation.

Similarly in the ridge waveguide structures as illustrated in FIGS. 2 to 4 and 18 to 20 in Embodiment 1, other than the high-mesa waveguide structure, a fabricated region may be embedded with the current block layer 19 to manufacture an embedded semiconductor laser.

In the embedded semiconductor laser 300 according to Embodiment 3 as well, output change of a laser beam emitted from the DFB unit 301 can be measured as change of a current amount detected by the PD unit 303, and the light emitting layer 1 in the DFB unit 301 and the core layer 2 in the PD unit 303 independently operate and thus can each have an optimum layer configuration. In addition, the effect of preventing a current path between the DFB unit 301 and the PD unit 303 is achieved. Moreover, height distribution of a stack surface can be uniformly fabricated by providing the current block layer 19, which achieves the effect of flattening a surface electrode, thereby manufacturing the semiconductor laser at high yield.

Embodiment 4

Figure 39:
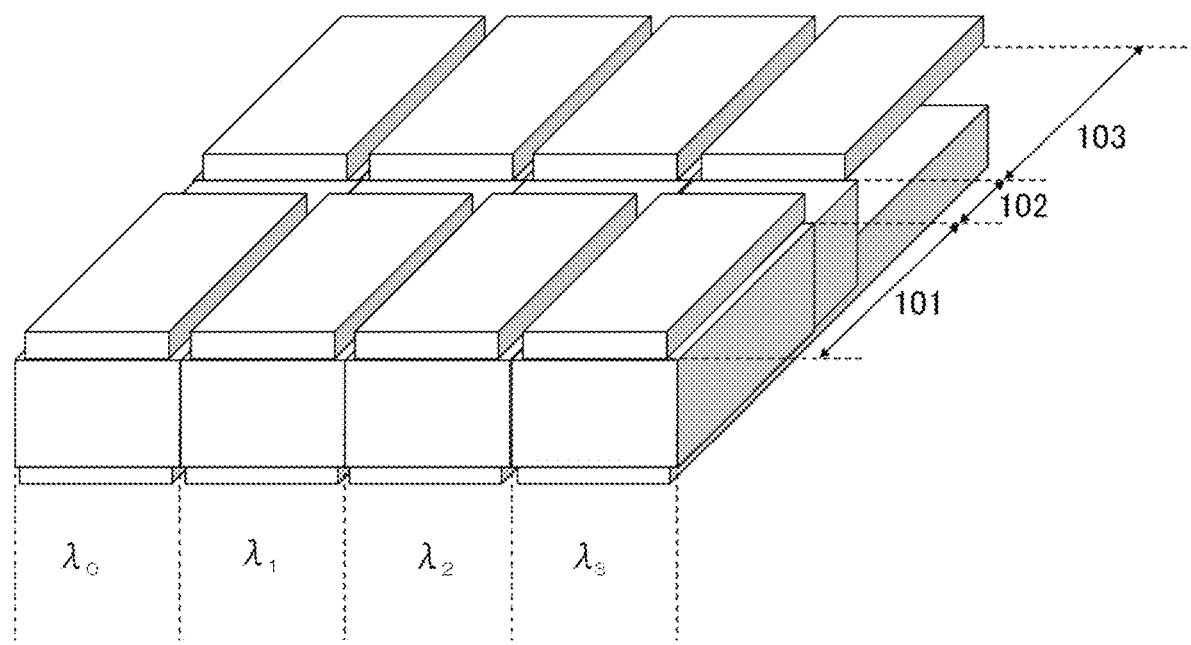
FIG. 39 is a perspective view of a semiconductor laser array according to Embodiment 4.

In each of the semiconductor lasers according to Embodiments 1, 2, and 3, an emission wavelength can be selected by the first diffraction grating layer 9 of the DFB unit, and the wavelength band and ratio of a laser beam to be reflected can be set by the second diffraction grating layer 10 in the DBR unit. Thus, as illustrated in FIG. 39, a plurality of the semiconductor lasers according to Embodiment 1, 2, or 3 may be arranged side by side in an array and integrated. In such a semiconductor laser array, when the emission wavelength of the DFB unit is different among the semiconductor lasers, the wavelength band and ratio of a laser beam to be reflected can be separately set by forming the first diffraction grating layer corresponding to each emission wavelength in the DBR unit.

In a semiconductor laser array according to Embodiment 4 as well, output change of a laser beam emitted from the DFB unit can be measured as change of a current amount detected by the PD unit, and the light emitting layer 1 in the DFB unit and the core layer 2 in the PD unit independently operate and thus can each have an optimum layer configuration. In addition, the effect of preventing a current path between the DFB unit and the PD unit is achieved.

Moreover, in the semiconductor laser array according to Embodiment 4, the distance between semiconductor lasers is not limited to the size of the PD unit, but the size of the semiconductor laser array can be reduced, and optical output characteristics do not degrade along with the size reduction.

In the present invention, the semiconductor lasers according to the embodiments may be combined or the semiconductor laser according to each embodiment may be modified or omitted as appropriate within the scope of the invention.

REFERENCE SIGNS LIST 1 light emitting layer; 2 core layer; 2a first core layer; 2b second core layer; 3, 3a, 3b back surface side first cladding layer; 4, 4a, 4b back surface side second cladding layer; 5, 5a, 5b back surface side third cladding layer; 6, 6a, 6b front surface side first cladding layer; 7, 7a, 7b front surface side second cladding layer; 8, 8a, 8b front surface side third cladding layer; 9 first diffraction grating layer; 10 second diffraction grating layer; 11 fourth cladding layer; 12 first contact layer; 13 second contact layer; 14 third contact layer; 15 front surface side first electrode; 16 front surface side second electrode; 17 back surface side electrode; 18 substrate; 19 current block layer; 20 back surface side cladding layer; 20a back surface side cladding layer; 20b back surface side cladding layer; 30 cladding layer; 40 front surface side cladding layer; 40a front surface side cladding layer; 40b front surface side cladding layer; 50 contact layer; 60 ridge structure interface; 100, 110, 200 semiconductor laser; 101, 111, 201 DFB unit; 102, 112, 202 DBR unit; 103, 113, 203 PD unit

The invention claimed is:
1. A semiconductor laser comprising:
a DFB unit including a back surface side first cladding layer of a first conductivity type, a first diffraction grating layer of a first conductivity type, a light emitting layer having a first MQW structure and emitting a laser beam, a front surface side first cladding layer of a second conductivity type, and a first contact layer of a second conductivity type which are stacked;

a DBR unit including a back surface side second cladding layer having a resistivity higher than that of the back surface side first cladding layer, a second diffraction grating layer reflecting part of the laser beam toward the DFB unit, a first core layer guiding a remnant of the laser beam and having a second MQW structure having an effective bandgap energy smaller than that of the first MQW structure, and a front surface side second cladding layer having a resistivity higher than that of the front surface side first cladding layer which are stacked; and a PD unit including a back surface side third cladding layer of a first conductivity type, a second core layer having the second MQW structure absorbing the remnant of the laser beam guided by the first core layer of the DBR unit, a front surface side third cladding layer of a second conductivity type, and a second contact layer of a second conductivity type which are stacked.

2. The semiconductor laser according to claim 1, comprising a back surface side electrode commonly provided on the back surface side first cladding layer, the back surface side second cladding layer and the back surface side third cladding layer.

3. The semiconductor laser according to claim 1, wherein the DFB unit includes a front surface side first electrode, and the PD unit includes a front surface side second electrode.

4. The semiconductor laser according to claim 1, wherein a resistivity of the front surface side second cladding layer is 10 times or more as high as that of the front surface side first cladding layer.

5. The semiconductor laser according to claim 1, wherein a resistivity of the back surface side second cladding layer is 10 times or more as high as that of the back surface side first cladding layer.

6. The semiconductor laser according to claim 1, wherein a thickness of each well layer included in the first MQW structure is smaller than that of each well layer included in the second MQW structure.

7. The semiconductor laser according to claim 1, wherein a ridge waveguide structure guiding a laser beam is formed.

8. The semiconductor laser according to claim 7, wherein the ridge waveguide structure is embedded with a current block layer.

9. The semiconductor laser according to claim 1, wherein a high-mesa waveguide structure guiding a laser beam is formed.

10. The semiconductor laser according to claim 9, wherein the high-mesa waveguide structure is embedded with a current block layer.

11. A semiconductor laser array comprising at least two of the semiconductor layers according to claim 1 which are arranged side by side in an array.

12. A method of manufacturing the semiconductor laser comprising:
sequentially forming part of a back surface side cladding layer and a cladding layer for diffraction grating formation through crystal growth on a substrate on which each part of a DFB unit, a DBR unit adjacent to the DFB unit, and a PD unit adjacent to the DBR unit is to be formed;
forming a first diffraction grating layer in the cladding layer for diffraction grating formation corresponding to the DFB unit and a second diffraction grating layer in the cladding layer for diffraction grating formation corresponding to the DBR unit by etching;
forming a remnant of the back surface side cladding layer on the cladding layer for diffraction grating formation through crystal growth;
injecting carriers into the back surface side cladding layers of the DFB unit and the PD unit;
forming a light emitting layer having a first MQW structure on the back surface side cladding layer through crystal growth;
after removing the light emitting layer in the DBR unit and the PD unit, forming a core layer having a second MQW structure having an effective bandgap energy smaller than that of the first MQW structure through crystal growth;
sequentially forming a front surface side cladding layer and a contact layer on the light emitting layer and the core layer through crystal growth;
injecting carriers into the front surface side cladding layer and the contact layer of the DFB unit and the PD unit;
removing the substrate by grinding;
forming front surface side electrodes on the contact layers of the DFB unit and the PD unit respectively; and
forming a back surface side electrode on a surface of the back surface side cladding layer exposed by removing the substrate.

13. The method of manufacturing the semiconductor laser according to claim 11, comprising forming a ridge waveguide structure guiding a laser beam by etching.

14. The method of manufacturing the semiconductor laser according to claim 13, comprising embedding the ridge waveguide structure with a current block layer.

15. The method of manufacturing the semiconductor laser according to claim 12, comprising forming a high-mesa waveguide structure guiding a laser beam by etching.

16. The method of manufacturing the semiconductor laser according to claim 15, comprising embedding the high-mesa waveguide structure with a current block layer.

* * * * *